(12) United States Patent
Lee et al.

(10) Patent No.: US 9,832,563 B2
(45) Date of Patent: Nov. 28, 2017

(54) HEADPHONE DRIVER FOR ATTENUATING POP AND CLICK NOISES AND SYSTEM ON CHIP HAVING THE SAME

(71) Applicant: SAMSUNG ELECTRONICS CO., LTD., Suwon-si, Gyeonggi-do (KR)

(72) Inventors: Myung-Jin Lee, Suwon-si (KR); Pan-Jong Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 363 days.

(21) Appl. No.: 14/542,936

(22) Filed: Nov. 17, 2014

(65) Prior Publication Data
US 2015/0237438 A1 Aug. 20, 2015

(30) Foreign Application Priority Data
Feb. 14, 2014 (KR) .................. 10-2014-0017350

(51) Int. Cl.
H04R 1/10 (2006.01)
H03G 3/34 (2006.01)
H04R 3/00 (2006.01)

(52) U.S. Cl.
CPC .......... H04R 1/1091 (2013.01); H03G 3/348 (2013.01); H04R 3/00 (2013.01)

(58) Field of Classification Search
CPC ......... H04R 1/1091; H04R 3/00; H03G 3/348
USPC .................... 381/74, 94.5, 94.8, 120, 28
See application file for complete search history.

(56) References Cited

U.S. PATENT DOCUMENTS

| | | | |
|---|---|---|---|
| 5,703,529 A | 12/1997 | Ghaffaripour et al. | |
| 5,939,938 A | 8/1999 | Kalb et al. | |
| 6,316,993 B1 | 11/2001 | Hellums | |
| 6,573,787 B2 * | 6/2003 | Ikin ................. | H03F 1/305 330/150 |
| 7,164,312 B1 | 1/2007 | Singh et al. | |
| 7,254,244 B2 | 8/2007 | Henson et al. | |

(Continued)

FOREIGN PATENT DOCUMENTS

| | | |
|---|---|---|
| KR | 10-0626987 B1 | 9/2006 |
| KR | 10-0681559 B1 | 2/2007 |

OTHER PUBLICATIONS

Jianlong Chen et al. A 62mW Stereo Class-G Headphone Driver with 108dB Dynamic Range and 600μA/Channel Quiescent Current, IEEE International Solid State Circuits Conf., Feb. 19, 2013 pp. 182-184.

*Primary Examiner* — Davetta W Goins
*Assistant Examiner* — Daniel Sellers
(74) *Attorney, Agent, or Firm* — Lee & Morse, P.C.

(57) ABSTRACT

A headphone driver includes a pre-main amplifier and a main amplifier. The pre-main amplifier receives an input signal from first and second node and outputs the input signal to a third node. The main amplifier is between the third node and a fourth node. A first switch is between the fourth node and a fifth node. A second switch is between the fourth node and a sixth node. A third switch is between the fourth node and a seventh node. A fourth switch is between the fifth and seventh nodes. A fifth switch is between the first and fifth nodes. A capacitor is between the third and fifth nodes. A first feedback resistor is between the first and seventh nodes. A second feedback resistor is between the second and sixth nodes, and the sixth and seventh nodes are connected to a speaker.

20 Claims, 31 Drawing Sheets

(56) References Cited

U.S. PATENT DOCUMENTS

| | | |
|---|---|---|
| 8,526,636 B1 | 9/2013 | Pai et al. |
| 2009/0196435 A1 | 8/2009 | Miao |
| 2013/0028441 A1 | 1/2013 | Chen et al. |

* cited by examiner

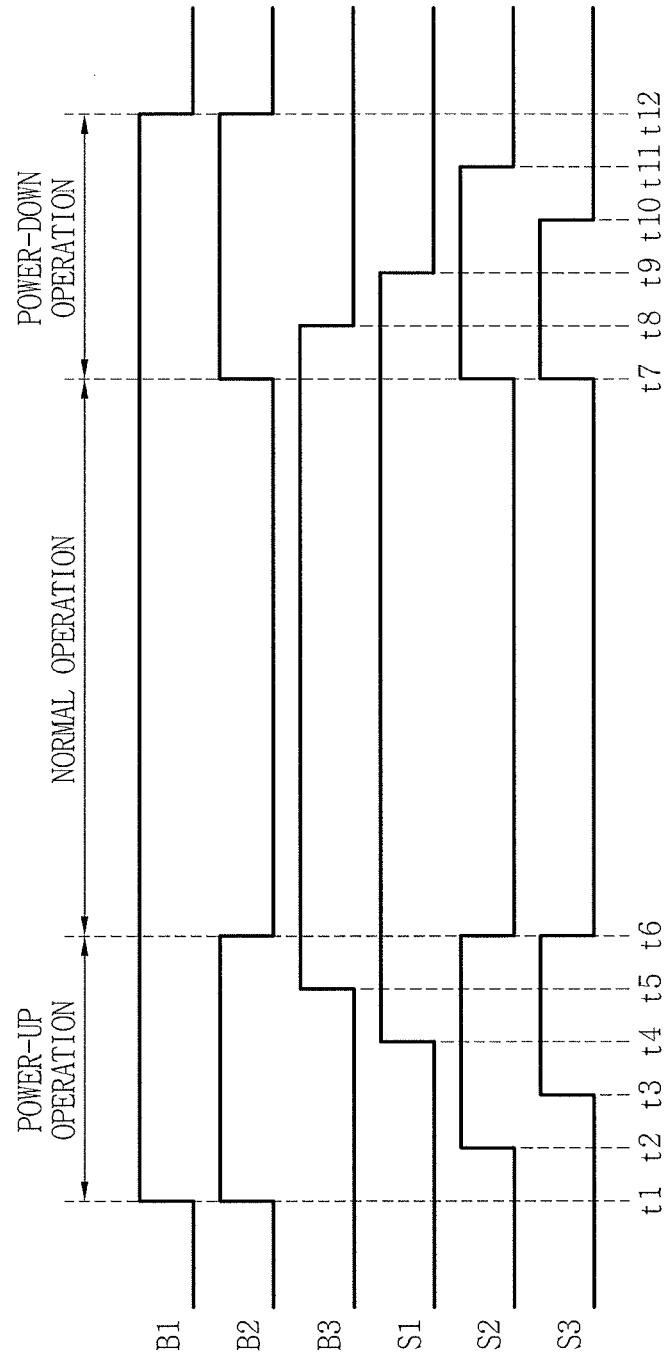

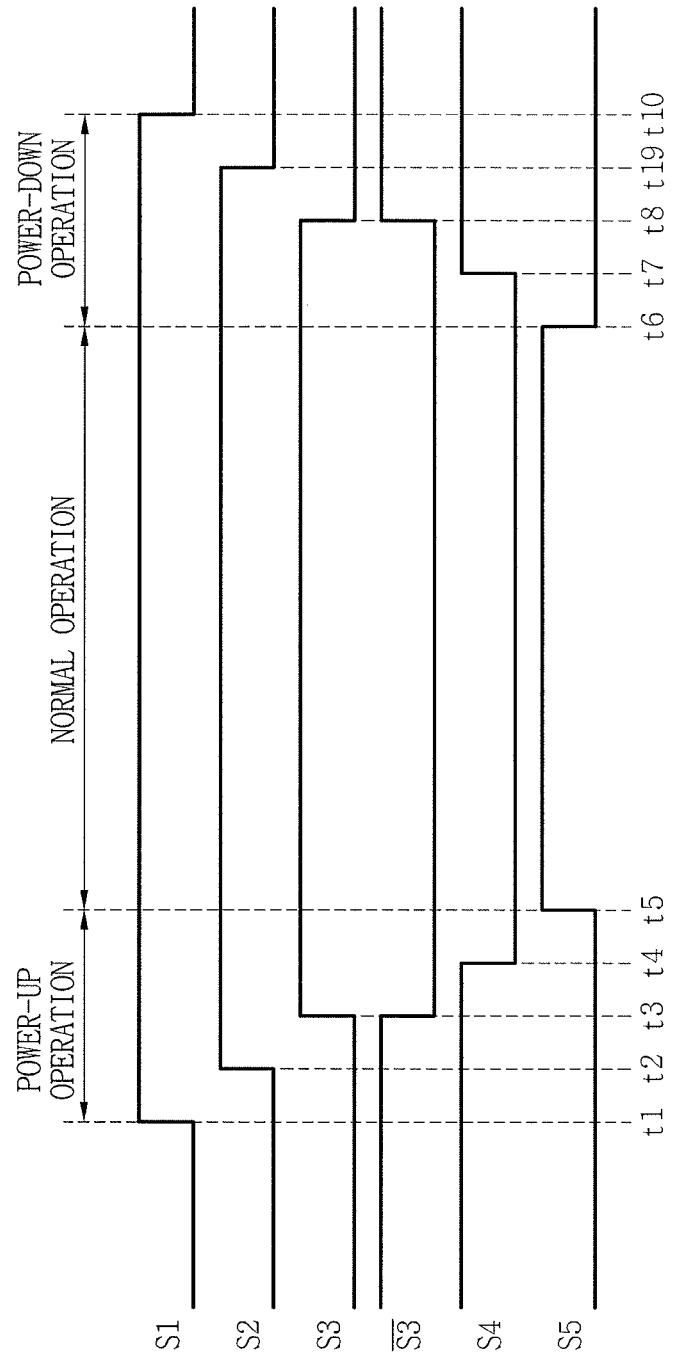

HEADPHONE DRIVER FOR ATTENUATING POP AND CLICK NOISES AND SYSTEM ON CHIP HAVING THE SAME

CROSS-REFERENCE TO RELATED APPLICATION

Korean Patent Application No. 10-2014-0017350, filed on Feb. 14, 2014, and entitled, "Headphone Driver For Attenuating Pop and Click Noises and System On Chip Having the Same," is incorporated by reference herein in its entirety.

BACKGROUND

1. Field

One or more embodiments described herein relate to a headphone driver and a system on chip (SOC) having the same.

2. Description of Related Art

Various types of multimedia devices have been developed. These devices include a portable audio playing apparatus for playing music and other sounds, and mobile communication terminals equipped with audio playing functions. These devices may decode data stored in a recording medium (e.g., cassette tape, a compact disc (CD), etc.), an audio file stored in a memory, or a broadcasting signal received from a broadcasting station. Once decoded, the devices may amplify the data, audio file, or broadcasting signal, and for output to a speaker or an earphone.

However, noises may be generated in the speaker or earphone, especially when turning an audio amplifier on or off. The noise may be referred to as pop or click noise.

SUMMARY

In accordance with one embodiment, a headphone driver includes at least one pre-main amplifier to receive an input signal from a first node and a second node, and to output the input signal to a third node; a main amplifier connected between the third node and a fourth node; a first switch connected between the fourth node and a fifth node; a second switch connected between the fourth node and a sixth node; a third switch connected between the fourth node and a seventh node; a fourth switch connected between the fifth node and the seventh node; a fifth switch connected between the first node and the fifth node; a capacitor connected between the third node and the fifth node; a first feedback resistor connected between the first node and the seventh node; and a second feedback resistor connected between the second node and the sixth node, wherein the sixth node and the seventh node are connected to a speaker.

The headphone driver may include a sixth switch connected between the first node and a first input port; and a seventh switch connected between the second node and a second input port. The headphone driver may include a digital sequencer configured to generate first to fifth on signals for controlling the first to seventh switches.

The headphone driver may include the at least one pre-main amplifier is activated in response to the first on signal, and the main amplifier is activated in response to the second on signal.

The third and fourth switches may be activated in response to the third on signal, the first and fifth switches may be activated in response to an inverted signal of the third on signal, the second switch may be activated in response to the fourth on signal, and the sixth and seventh signals may be activated in response to the fifth on signal.

In a power-up operation, the digital sequencer may sequentially perform operations which include activating the first and fourth on signals, activating the second on signal, activating the third on signal, deactivating the fourth on signal, and activating the fifth on signal. In a normal operation, the digital sequencer may activate the first to third and fifth on signals and deactivates the fourth on signal. In a power-down operation, the digital sequencer may sequential performs operations which include deactivating the fifth on signal, activating the fourth on signal, deactivating the third on signal, deactivating the second on signal, and deactivating the first on signal. The sixth node may be connected to a ground voltage, and the seventh node may have the ground voltage in power-up and power-down operations.

In accordance with another embodiment, a system-on-chip (SOC) includes a headphone driver and a power supply unit to provide power for the headphone driver. The headphone driver includes at least one pre-main amplifier to receive an input signal from a first node and a second node, and to output the input signal to a third node; a main amplifier connected between the third node and a fourth node; a first switch connected between the fourth node and a fifth node; a second switch connected between the fourth node and a sixth node; a third switch connected between the fourth node and a seventh node; a fourth switch connected between the fifth node and the seventh node; a fifth switch connected between the first node and the fifth node; a capacitor connected between the third node and the fifth node; a first feedback resistor connected between the first node and the seventh node; a second feedback resistor connected between the second node and the sixth node; a sixth switch connected between the first node and a first input port; and a seventh switch connected between the second node and a second input port, wherein the sixth node and the seventh node are connected to a speaker.

The SOC may include a digital sequencer configured to generate first to fifth on signals for controlling the first to seventh switches. The at least one pre-main amplifier may be activated in response to the first on signal, the main amplifier may be activated in response to the second on signal, the third and fourth switches may be activated in response to the third on signal, the first and fifth switches may be activated in response to an inverted signal of the third on signal, the second switch may be activated in response to the fourth on signal, and the sixth and seventh signals may be activated in response to the fifth signal.

In a power-up operation, the digital sequencer may sequentially perform operations which include activating the first and fourth on signals, activating the second on signal, activating the third on signal, deactivating the fourth on signal, and activating the fifth on signal. In a normal operation, the digital sequencer may activate the first to third and fifth on signals and deactivates the fourth on signal. In a power-down operation, the digital sequencer may sequentially perform operations which include deactivating the fifth on signal, activating the fourth on signal, deactivating the third on signal, deactivating the second on signal, and deactivating the first on signal. The SOC may include a power management integrated circuit and/or a audio chip.

In accordance with another embodiment, a circuit includes a first amplifier to receive input signals; a second amplifier coupled between an output of the first amplifier and a first node coupled to a speaker; and a first switch between the first node and a reference potential; and a second switch between the first node and an input of the first amplifier, wherein the first switch couples the first node to the reference potential and the second switch couples the first node to the input of the first amplifier during a power-up operation and during a power-down operation, and wherein the first switch and the second switch are open during a period between the power-up and power-down operation. The input signals may have different phases.

A second node may be coupled to a first input of the first amplifier and the reference potential; and a third node may be coupled to a second input of the first amplifier and the first node. The first node may be coupled to a first input of the speaker, and the reference potential may be coupled to a second input of the speaker and the first node through the first switch.

The circuit may include a third amplifier coupled between the first and second amplifier; and a third switch coupled between the first node and a first input of the third amplifier, wherein the first input of the third amplifier is coupled to an output of the first amplifier and wherein a second input of the third amplifier is coupled to the reference potential.

BRIEF DESCRIPTION OF THE DRAWINGS

Features will become apparent to those of skill in the art by describing in detail exemplary embodiments with reference to the attached drawings in which:

FIG. 4 is a timing diagram for the headphone driver in FIG. 1;
FIG. 7 is a timing diagram for the headphone driver in FIG. 5 according to one embodiment.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

Figure 1:
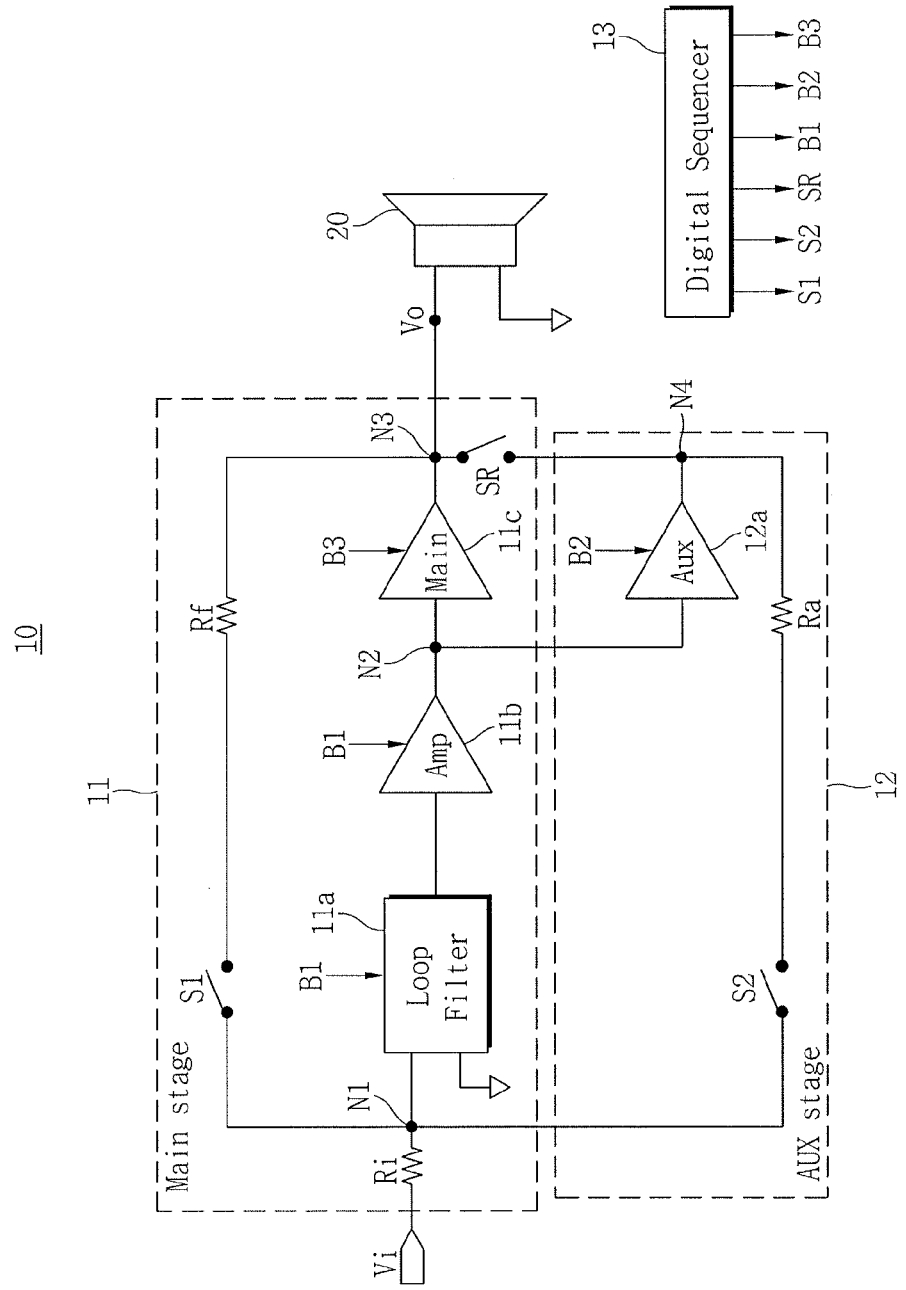
FIG. 1 illustrates a related art headphone driver.

FIG. 1 illustrates a headphone driver 10 of the related art which includes a main stage 11, an auxiliary stage 12, and a digital sequencer 13. The main stage 11 filters and amplifies an input signal Vi to generate an output signal Vo. The main stage 11 outputs the output signal Vo to a speaker 20 through a third node N3.

To generate the output signal Vo, the main stage 11 includes an input resistor Ri, a loop filter 11a, a pre-main amplifier 11b, a main amplifier 11c, a first switch S1, a third switch SR, and a feedback resistor Rf. The loop filter 11a and the pre-main amplifier 11b operate in response to a first amplifying control signal B1. The main amplifier 11c operates in response to a third amplifying control signal B3.

Particularly, the input resistor Ri is connected between the input port and a first node N1. The loop filter 11a and the pre-main amplifier 11b are sequentially connected between the first node N1 and a second node N2. The main amplifier 11c is connected between the second node N2 and the third node N3. The first switch S1 and the feedback resistor Rf are sequentially connected between the first node N1 and the third node N3. The third switch SR is connected between the third node N3 and a fourth node N4.

In an attempt to attenuate pop and click noise, the auxiliary stage 12 defines a voltage of the third node N3 (which is an output node of the main stage 11) as a ground voltage. For this, the auxiliary stage 12 includes an auxiliary amplifier 12a, a second switch S2, and an auxiliary resistor Ra. The auxiliary amplifier 12a operates in response to a second amplifying control signal B2.

Specifically, the auxiliary amplifier 12a is connected between the second node N2 and a fourth node N4. The second switch S2 and the auxiliary resistor Ra are sequentially connected between the first node N1 and the fourth node N4. The main amplifier 11c and the auxiliary amplifier 12a may include an inverter.

The digital sequencer 13 controls a plurality of switches for controlling operations of the main stage 11 and the auxiliary stage 12. The digital sequencer 13 controls operation of the main stage 11 by the first and third switches S1 and SR, and the first and third amplifying control signals B1 and B3. Further, the digital sequencer 13 controls operation of the auxiliary stage 12 by the second switch S2 and the second amplifying control signal B2.

Figure 2:
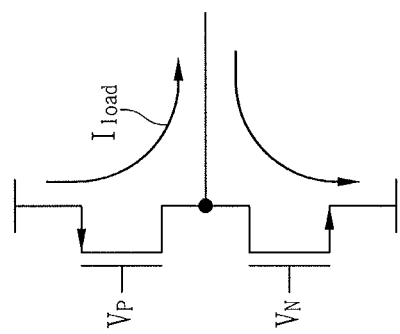
FIG. 2 illustrates a main amplifier in FIG. 1.

FIG. 2 illustrates a circuit for the main amplifier 11c in FIG. 1. Referring to FIGS. 1 and 2, the main amplifier 11c may be implemented as an inverter. Since a voltage level of an output node is not defined, when the main amplifier 11c is activated or deactivated, a transient load current Iload may flow to the third node N3 or the fourth node N4. Accordingly, a pop noise may be generated. When power is turned on, the main amplifier 11c is activated. When power is turned off, the main amplifier 11c is deactivated.

Figure 3A:
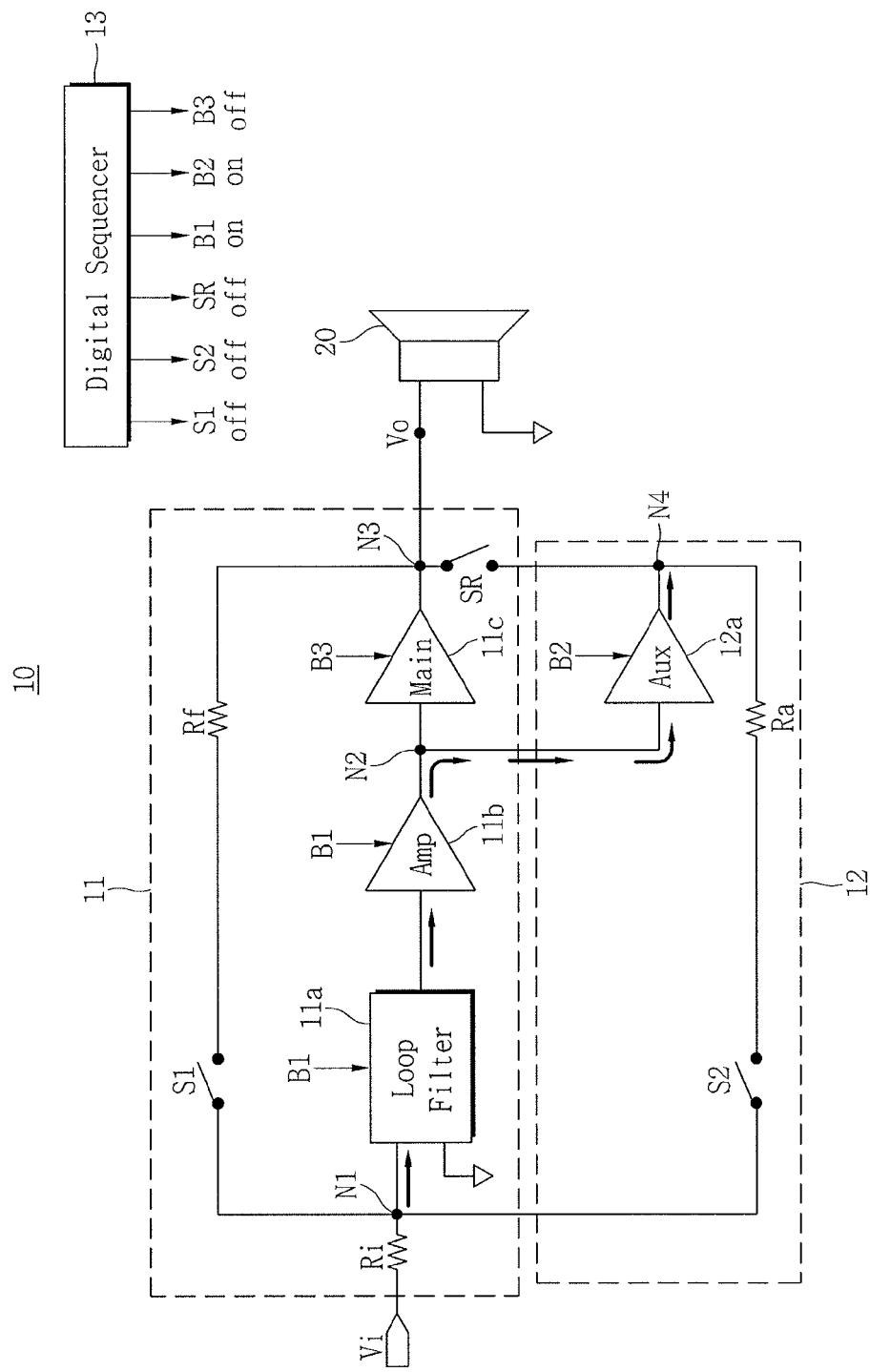
FIGS. 3A to 3K illustrate operation of the headphone driver in FIG. 1.

FIGS. 3A to 3K illustrate operation of the headphone driver in FIG. 1, and FIG. 4 is a timing diagram for the headphone driver in FIG. 1. Referring to FIGS. 3A and 4, the headphone driver 10 performs a power-up operation from time t1 to time t6. The headphone driver 10 attempts to attenuate pop noise due to the power-up operation.

Before time t1, the digital sequencer 13 deactivates the first to third amplifying control signals B1 to B3 and the first to third switches S1, S2 and SR. At time t1, the digital sequencer 13 activates the first and second amplifying control signals B1 and B2. The loop filter 11a and the pre-main amplifier 11b are activated in response to the first amplifying control signal B1. The auxiliary amplifier 12a is activated in response to the second amplifying control signal B2.

Figure 3B:
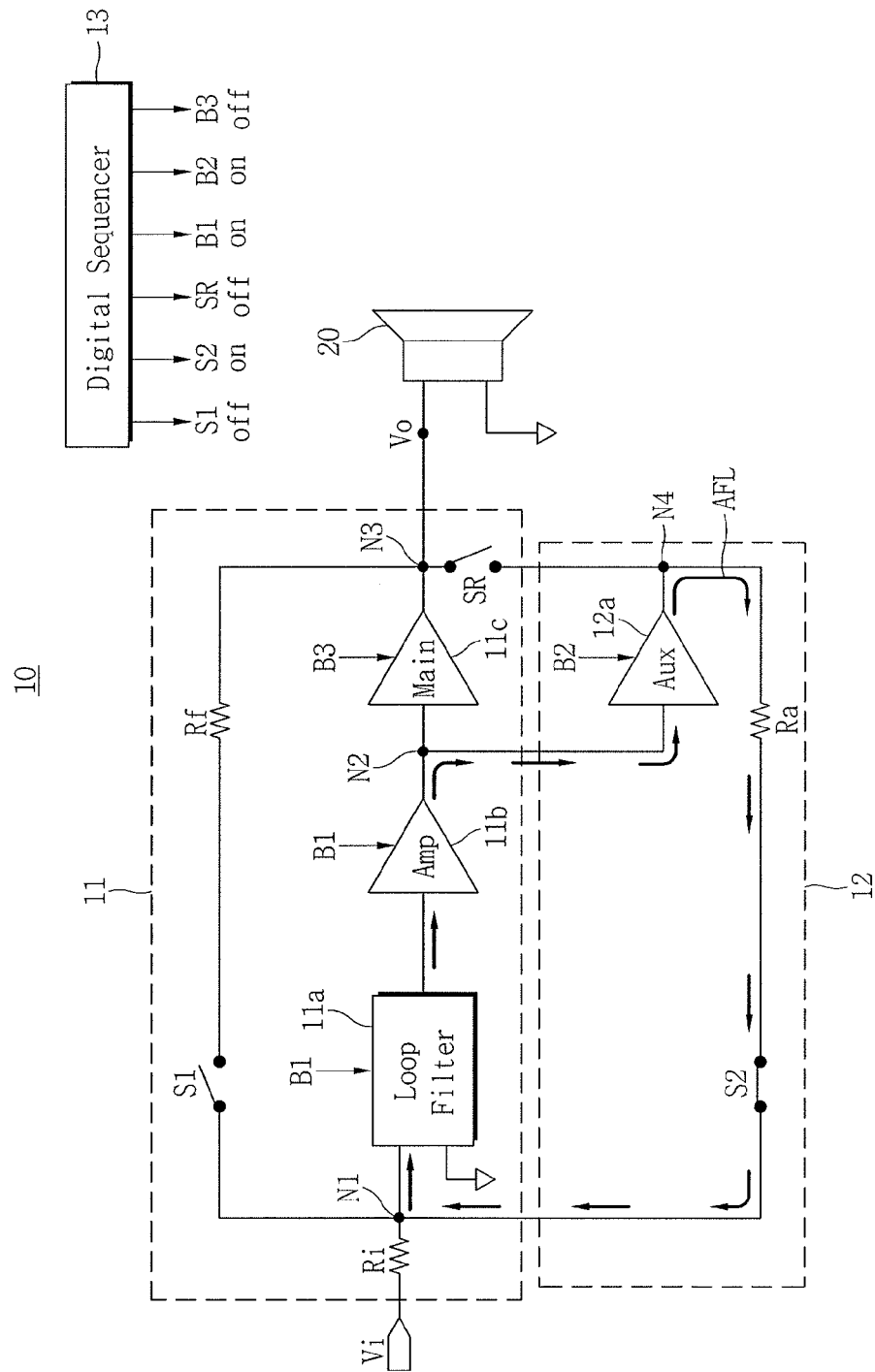

Referring to FIGS. 3B and 4, at the time t2, the digital sequencer 13 activates the second switch S2. Accordingly, an auxiliary feedback loop AFL driving the auxiliary stage 12 is formed.

Figure 3C:
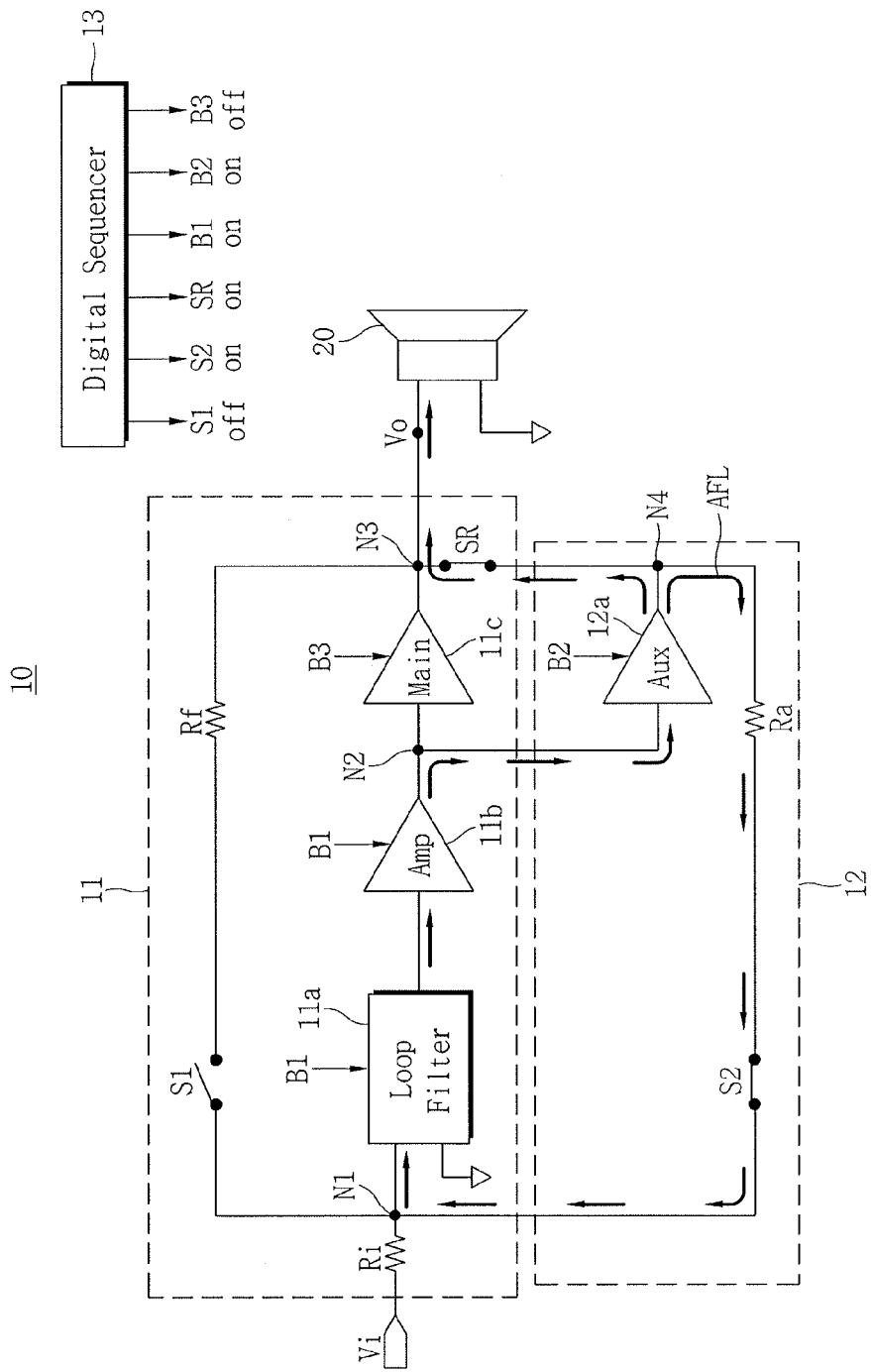

Referring to FIGS. 3C and 4, at time t3, the digital sequencer 13 activates the third switch SR. Accordingly, a potential level of the third node N3 is equal to that of the fourth node N4. The fourth node N4 is set as a ground voltage by the auxiliary amplifier 12a.

Because the third node N3 is an output node and the potential level of the third node N3 is defined as the ground voltage, a pop noise may be attenuated when the power is switched on.

Figure 3D:
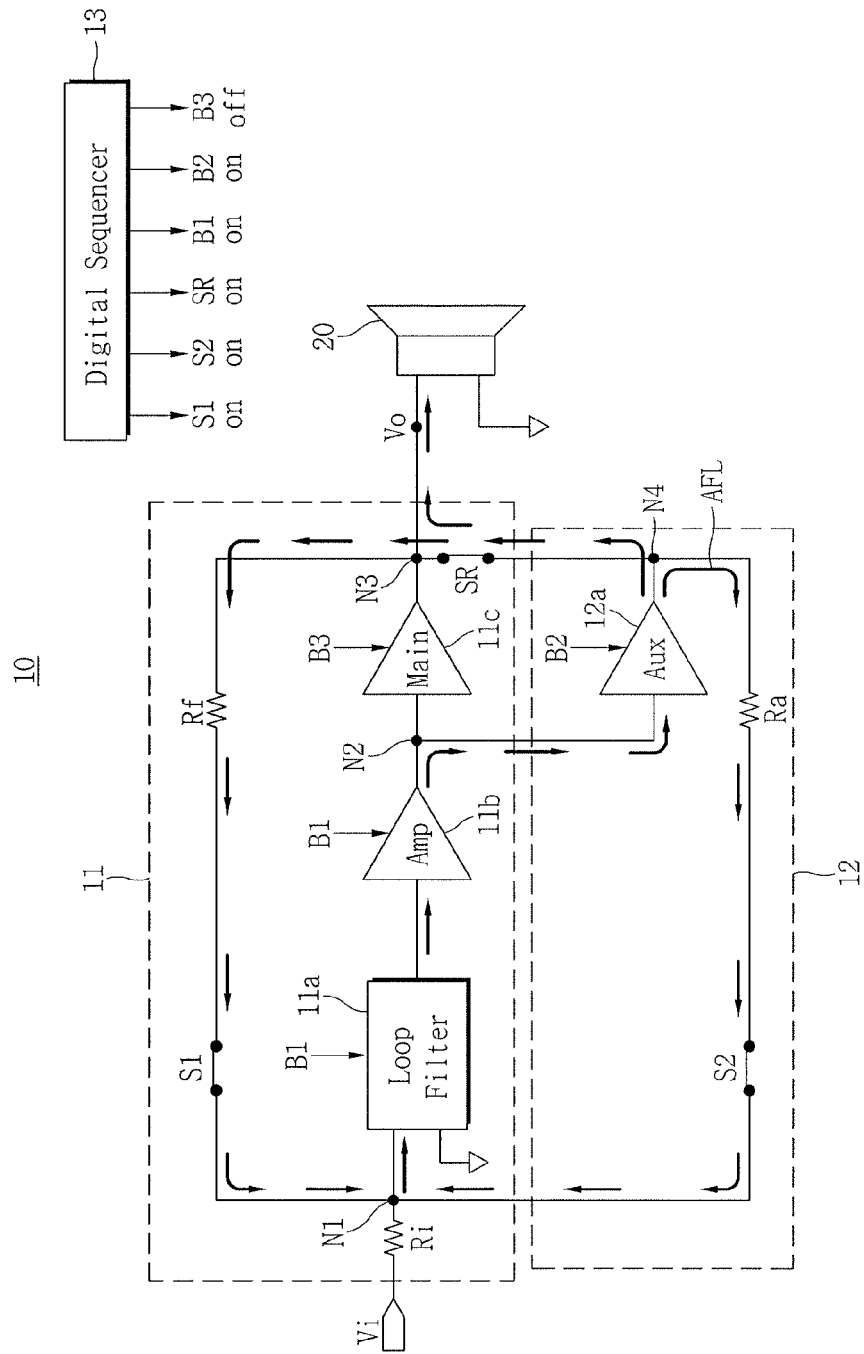

Referring to FIGS. 3D and 4, at time t4, the digital sequencer 13 first activates the first switch S1 before activating the main amplifier 11c.

Figure 3E:
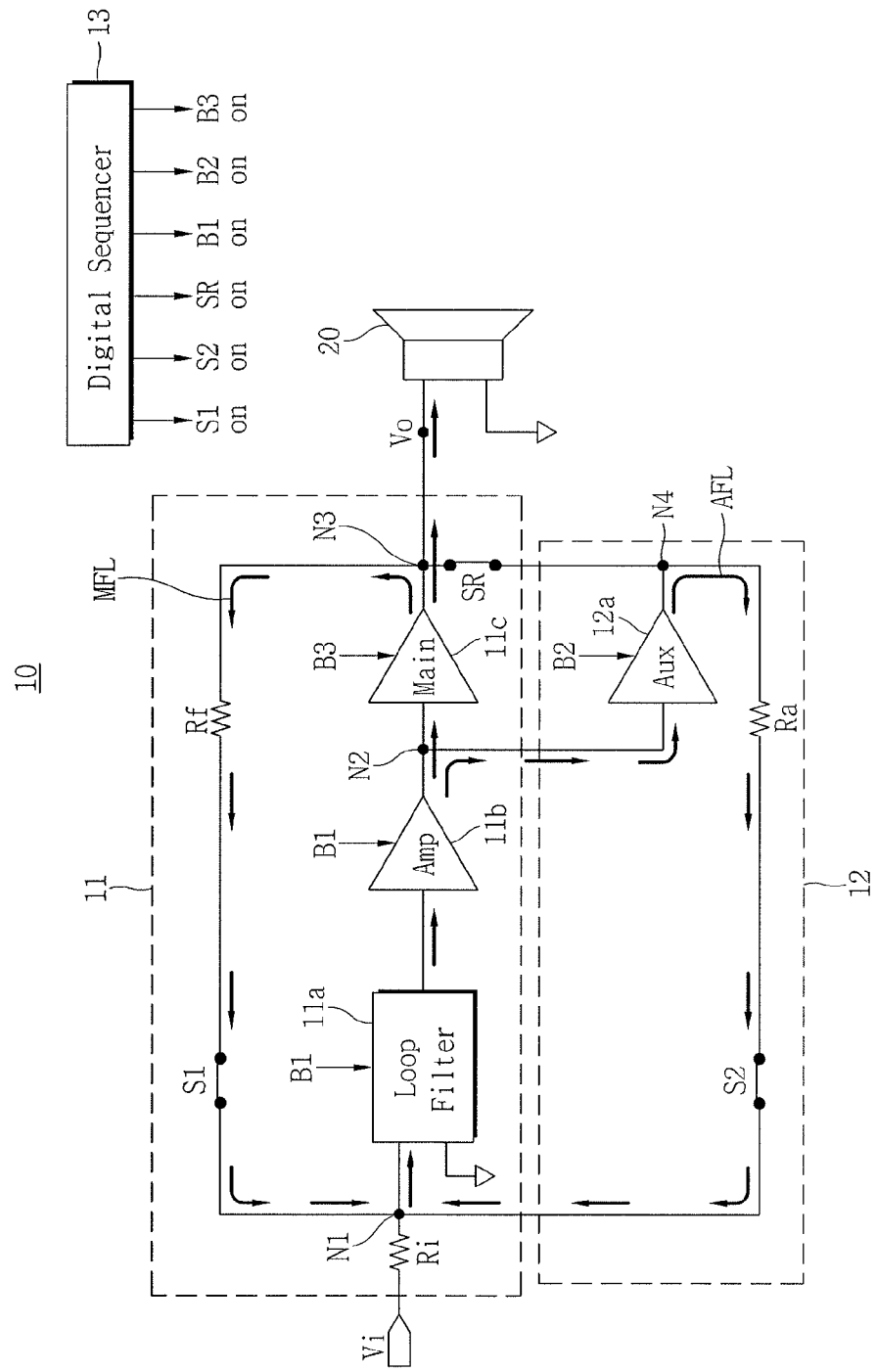

Referring to FIGS. 3E and 4, at time t5, the digital sequencer 13 activates the third amplifying control signal B3. The main amplifier 11c is activated in response to the third amplifying control signal B3. When the main amplifier 11c is activated, a main feedback loop MFL is formed. The third node N3 is set as the ground voltage by the main amplifier 11c.

Figure 3F:
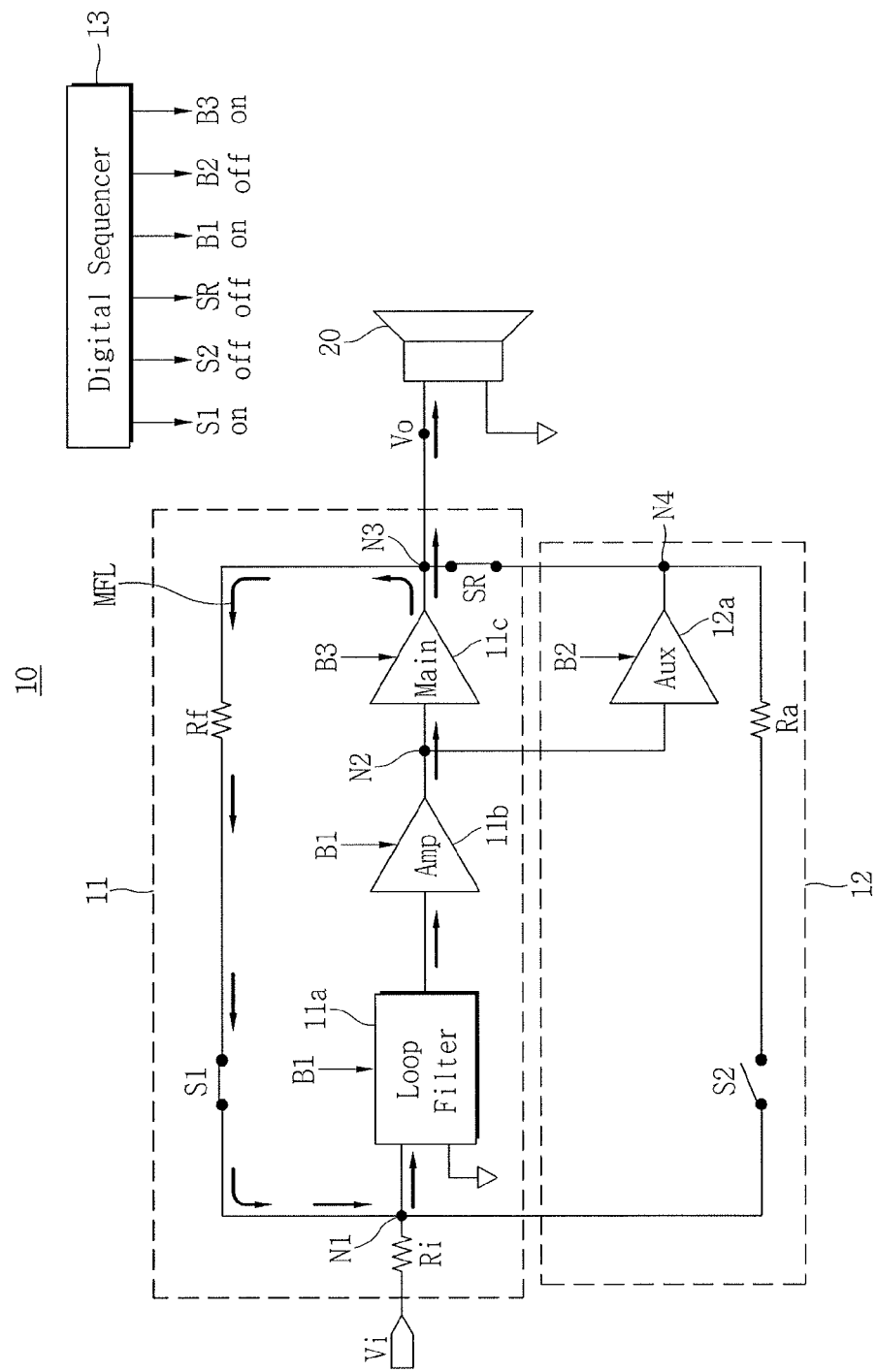

Referring to FIGS. 3F and 4, from time t6 to time t7, the headphone driver 10 performs normal operation. For example, the headphone driver 10 filters and amplifies an input signal Vi to output an output signal Vo and outputs the output signal Vo to a speaker 20 through the third node N3.

At time t6, the digital sequencer 13 deactivates the second amplifying control signal B2 and the second and third switches S2 and SR. Accordingly, only the main feedback loop MFL driving the main stage 11 is formed.

Figure 3G:
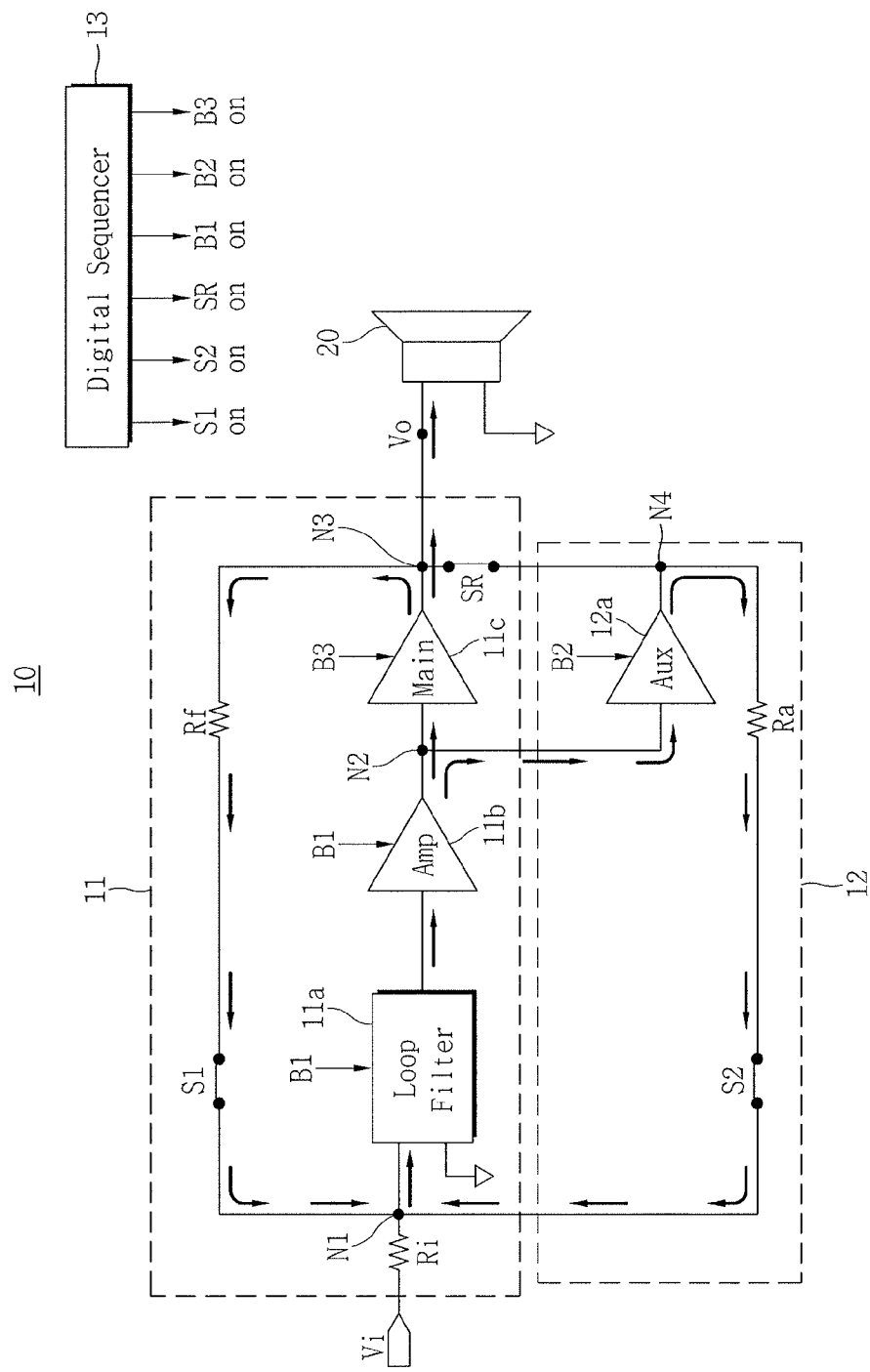

Referring to FIGS. 3G and 4, from time t7 to time t12, the headphone driver 10 performs a power-down operation. At time t7, the digital sequencer 13 activates the second amplifying control signal B2 and the second and third switches S2 and SR. The third node N3 is set as a ground voltage by the main amplifier 11c.

Figure 3H:
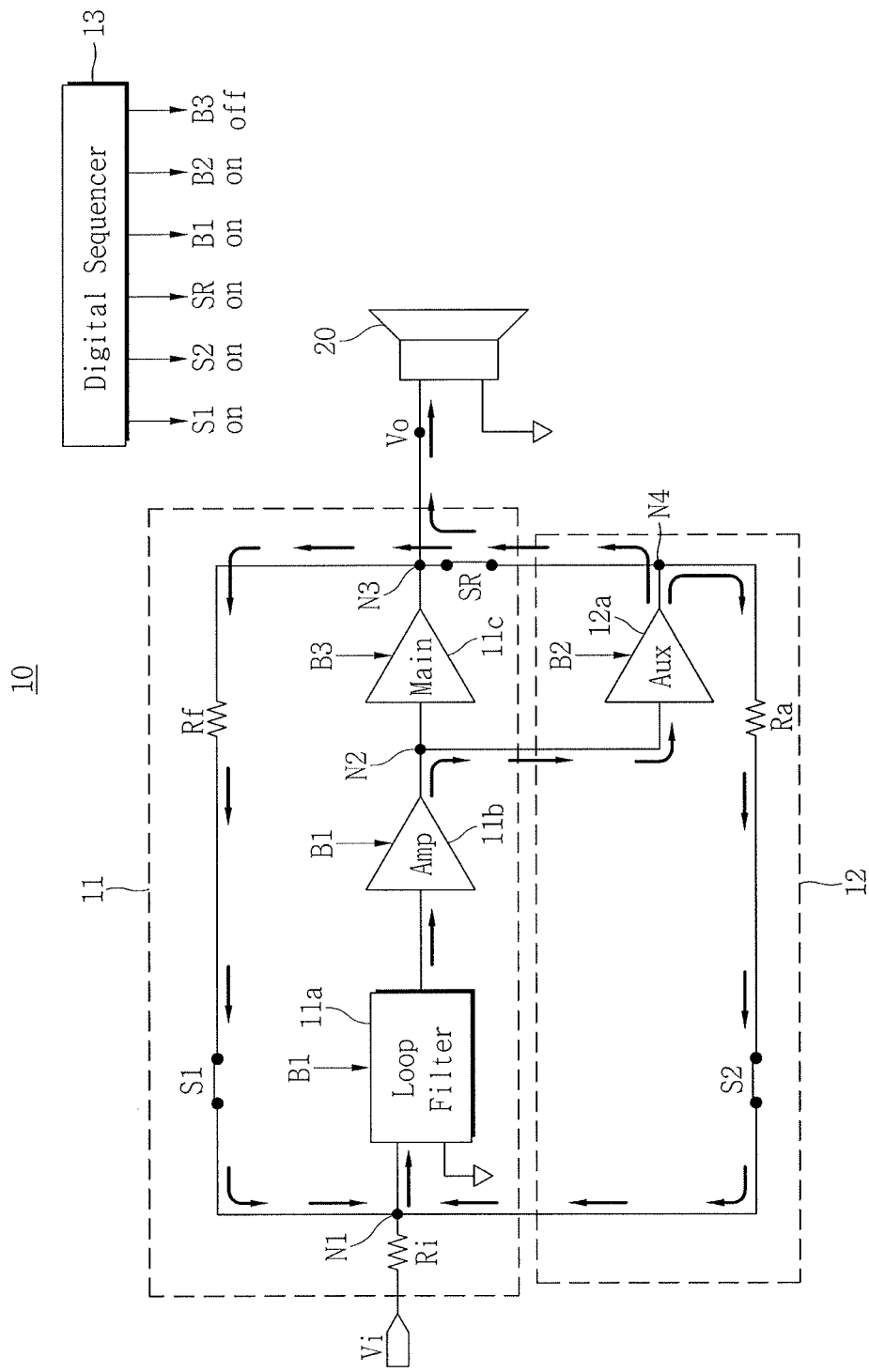

Referring to FIGS. 3H and 4, at time t8, the digital sequencer 13 deactivates the third amplifying control signal B3. Accordingly, the main amplifier 11c is deactivated. The third node 6 N3 is set as the ground voltage by the auxiliary amplifier 12a.

Figure 3I:
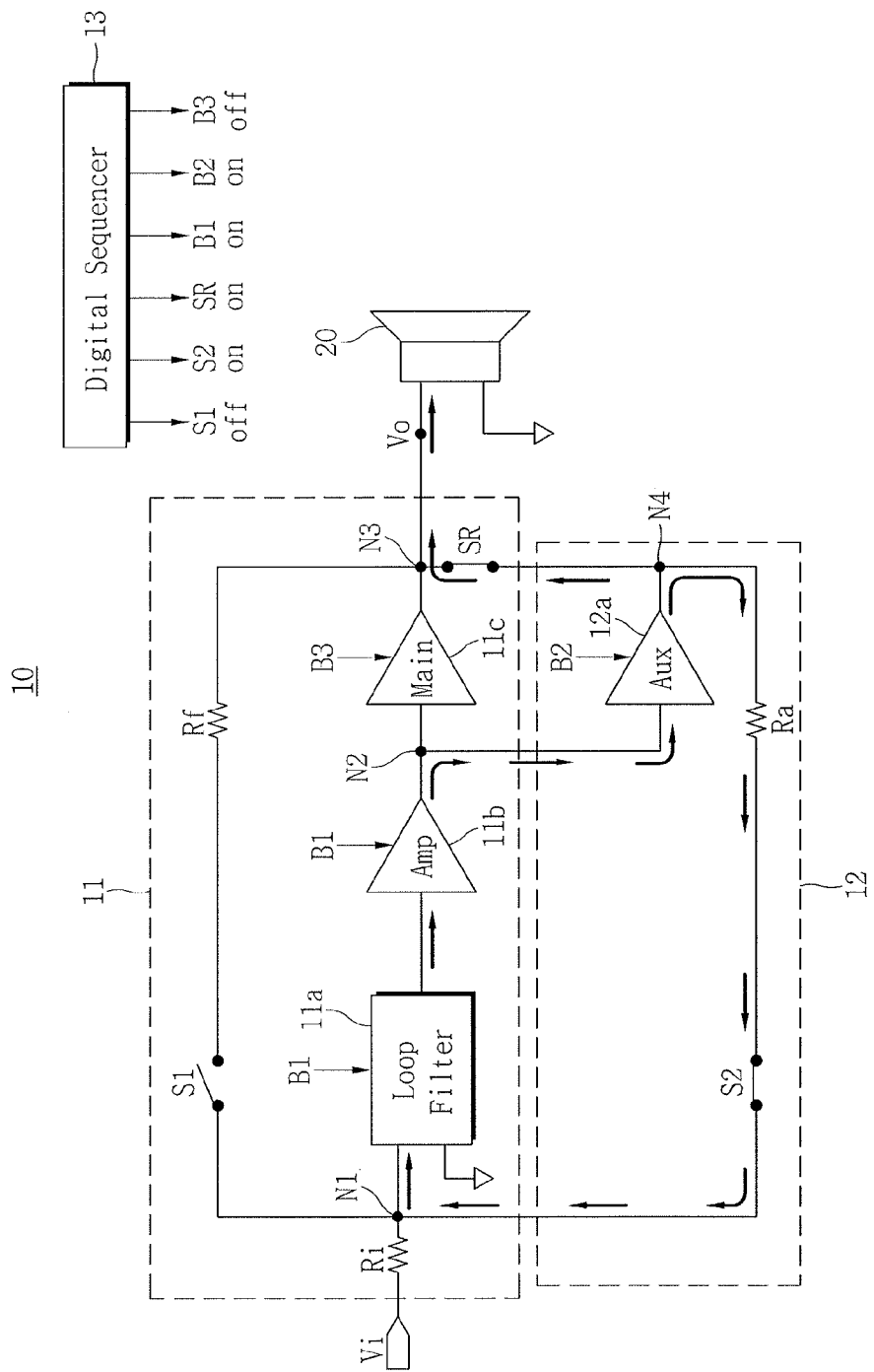

Referring to FIGS. 3I and 4, at time t9, the digital sequencer 13 deactivates the first switch S1. The third node N3 is set as the ground voltage by the auxiliary amplifier 12a.

Figure 3J:
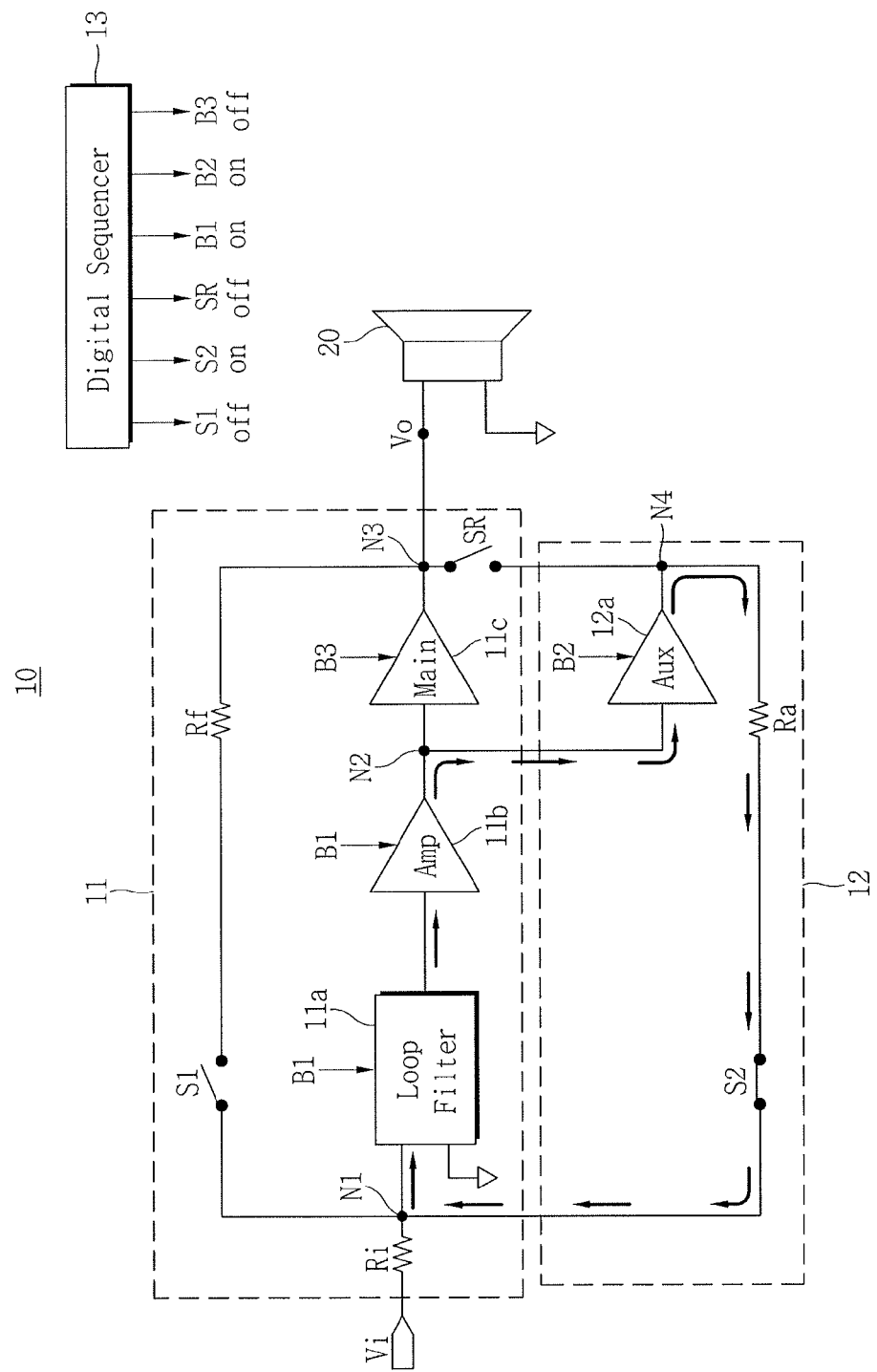

Referring to FIGS. 3J and 4, at time t10, the digital sequencer 13 deactivates the third switch SR. The third node N3 which is an output node maintains a floating state.

Figure 3K:
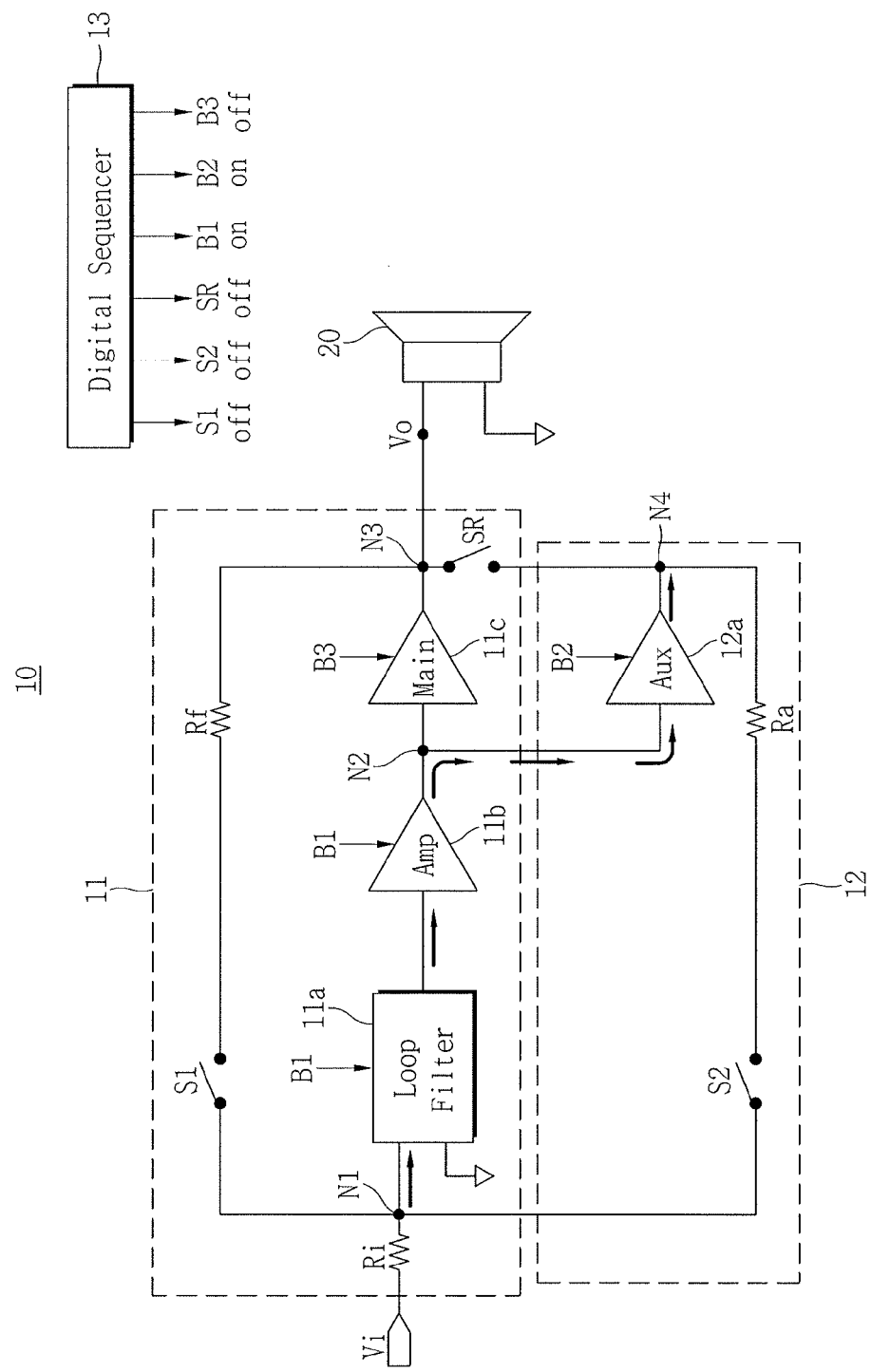

Referring to FIGS. 3K and 4, at time t11, the digital sequencer 13 deactivates the second switch S2. The third node N3 which is the output node maintains the floating state.

After time t12, the digital sequencer 13 deactivates the first and second amplifying control signals B1 and B2. For example, the digital sequencer 13 deactivates the first and second amplifying control signals B1 and B2 and the first to third switches S1, S2, and SR. The third node N3 which is the output node maintains the floating state. Accordingly, the output node may continuously maintain the ground voltage.

Figure 5:
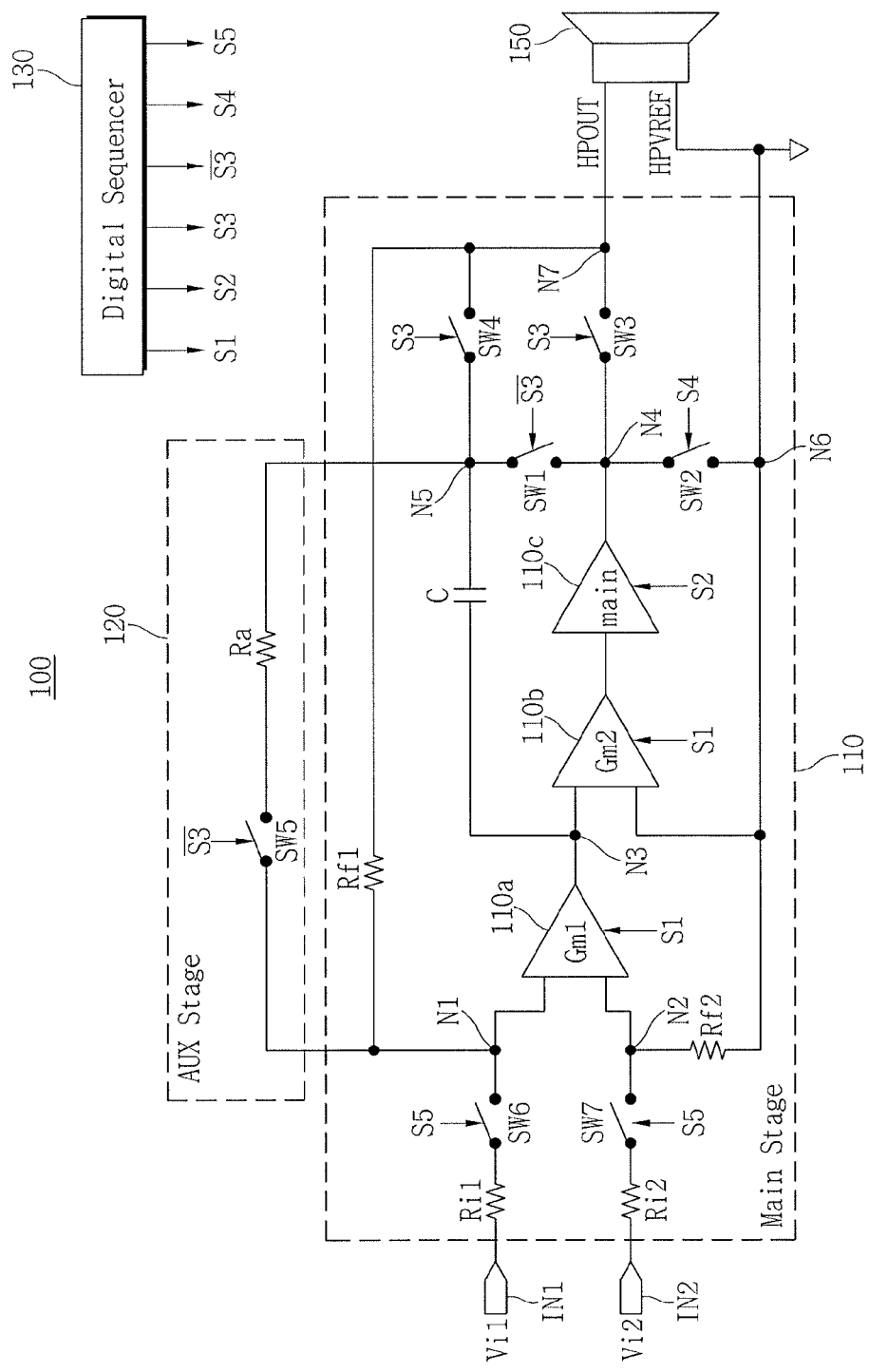
FIG. 5 illustrates an embodiment of a headphone driver.

FIG. 5 illustrates an embodiment of a headphone driver 100 which includes a main stage 110, an auxiliary stage 120, and a digital sequencer 130. The main stage 110 amplifies first and second input signals Vi1 and Vi2 and outputs the amplified signals to a speaker 150. In one embodiment, each of the first and second input signals Vi1 and Vi2 has an inverting phase with respect to each other.

The main stage 110 includes first and second resistors Ri1 and Ri2, first and second pre-main amplifiers 110a and 110b, a main amplifier 110c, first to fourth switches SW1 to SW4, sixth and seventh switches SW6 and SW7, a capacitor C, and first and second feedback resistors Rf1 and Rf2. Each of the pre-main amplifiers 110a and 110b operates in response to a first on signal S1. The main amplifier 110c operates in response to a second on signal S2.

Inputs of the first pre-main amplifier 110a are connected to a first node N1 and a second node N2, respectively. An output of the first pre-main amplifier 110a is connected to a third node N3. Inputs of the second pre-main amplifier 110b are connected to the third node N3 and a sixth node N6, respectively. An output of the second pre-main amplifier 110b is connected to an input of the main amplifier 110c. An input of the main amplifier 110c is connected to the output of the second pre-main amplifier 110b. An output of the main amplifier 110c is connected to a fourth node N4.

The first and second pre-main amplifiers 110a and 110b and the main amplifier 110c amplify the first and second input signals Vi1 and Vi2, to output an amplified signal to the speaker 150 through an output node HPOUT. In one embodiment, the main amplifier 110c may include an inverter. Because a voltage level of the output node HPOUT is not defined, a transient load current may flow to an output terminal when the main amplifier 110c is activated or deactivated. Accordingly, a pop noise may be generated.

The first switch SW1 is connected between the fourth node N4 and a fifth node N5. The second switch SW2 is connected between the fourth node N4 and the sixth node N6. The third switch SW3 is connected between the fourth node N4 and a seventh node N7. The fourth switch SW4 is connected between the fifth node N5 and the seventh node N7.

The first input resistor Ri1 and the sixth switch SW6 are sequentially connected between a first input terminal IN1 and the first node N1. The second input resistor Ri2 and the seventh switch SW7 are sequentially connected between a second input terminal IN2 and the second node N2.

The capacitor C is connected between the third node N3 and the fifth node N5. The first feedback resistor Rf1 is connected between the first node N1 and the seventh node N7. The second feedback resistor Rf2 is connected between the second node N2 and the sixth node N6.

In order to attenuate pop and click noise, the auxiliary stage 120 may control the output node HPOUT of the main stage 110 based on a reference (e.g., ground) voltage. For this, the auxiliary stage 120 includes a fifth switch SW5 and an auxiliary resistor Ra. The fifth switch SW5 and the auxiliary resistor Ra are sequentially connected between the first node N1 and the fifth node N5.

The digital sequencer 130 controls a plurality of switches for controlling operation of the main stage 110 and the auxiliary stage 120. For example, the digital sequencer 130 generates first to fifth on signals S1 to S5 for controlling the switches SW1 to SW7.

The first and fifth switches SW1 and SW5 are turned on in response to an inverted signal $\overline{S3}$ of the third on signal S3. The second switch SW2 is turned on in response to the fourth on signal S4. The third and fourth switches SW3 and SW4 are turned on in response to the third on signal S3. The sixth and seventh switches SW6 and SW7 are turned on in response to the fifth on signal S5. The speaker 150 includes an output node HPOUT and a reference node HPVREF set to a ground voltage.

During the power-up operation, the digital sequencer 130 sequentially performs operations of activating the first and fourth on signals S1 and S4, activating the second on signal S2, activating the third on signal S3, activating the fourth on signal S4, and activating the fifth on signal S5.

During normal operation, the digital sequencer 130 performs operations of activating the first to third, and fifth on signals S1 to S3 and S5, and deactivating the fourth signal S4.

During the power-down operation, the digital sequencer 130 sequentially performs operations of deactivating the fifth on signal S5, activating the fourth on signal S4, deactivating the third on signal S3, deactivating the second on signal S2, and deactivating the first one signal S1.

Figure 6A:
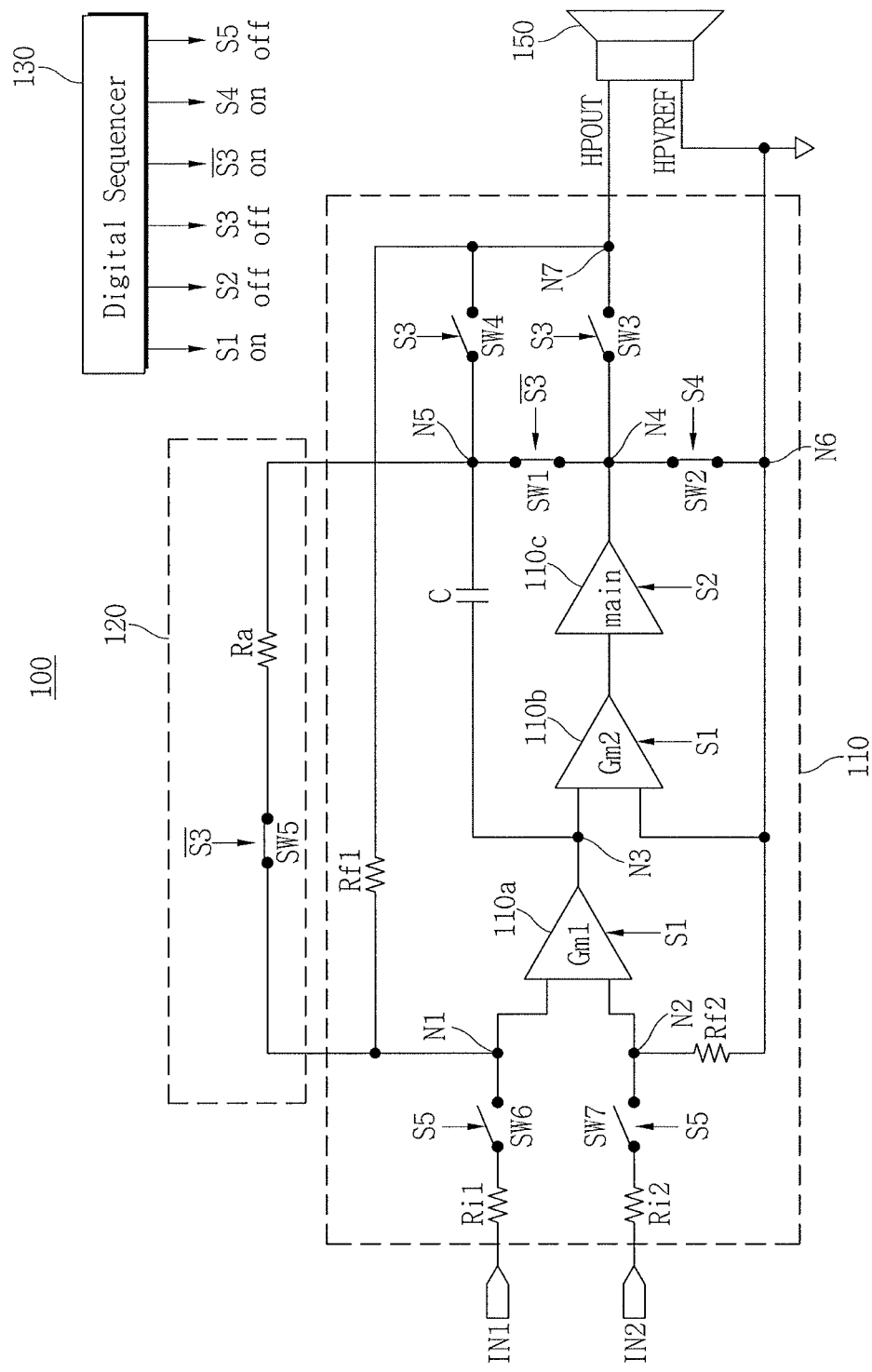
FIG. 6A to 6I illustrate operation of the headphone driver in FIG. 5 according to one embodiment.
Figure 6B:
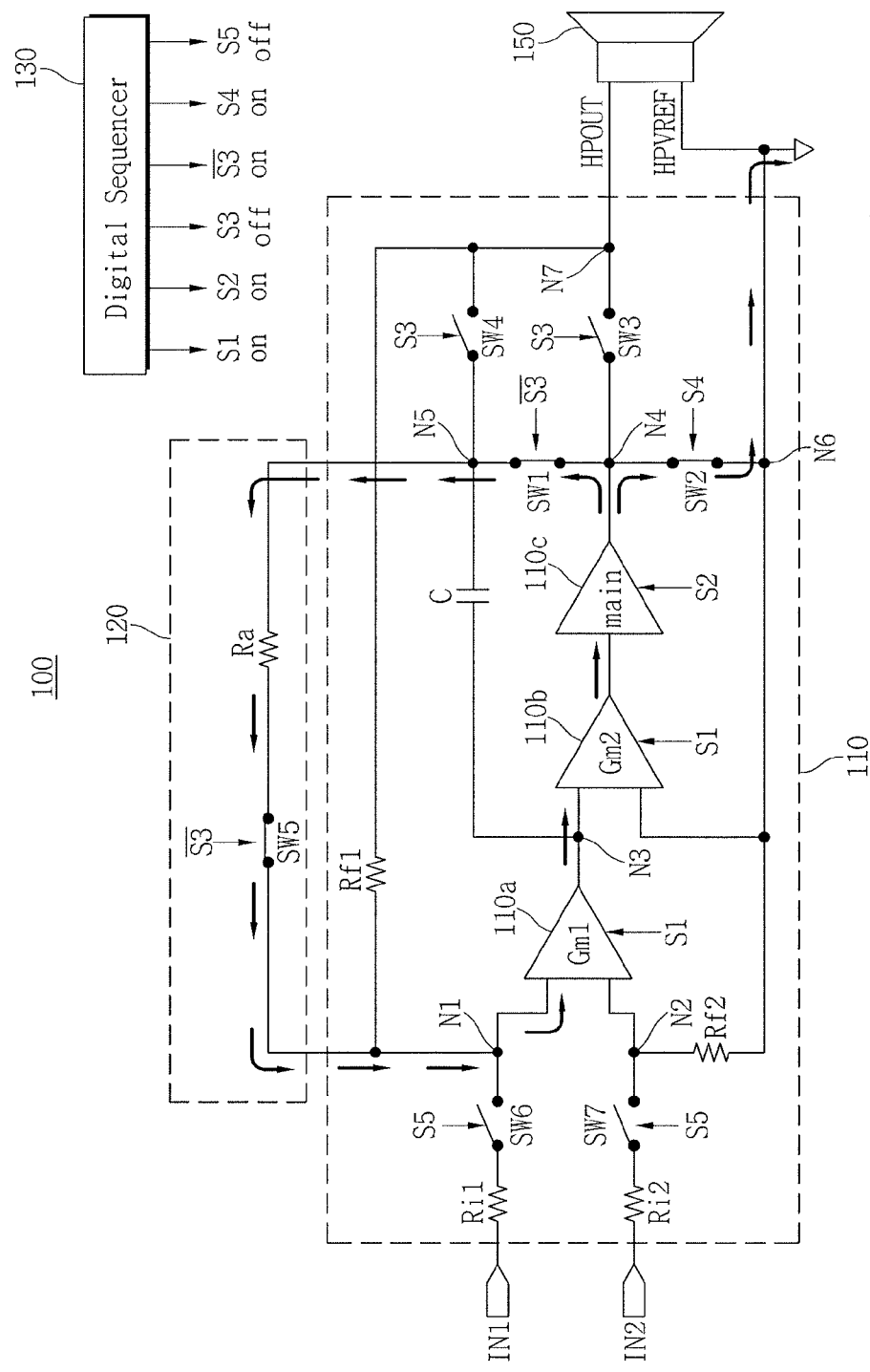

FIG. 6A to 6I illustrate operation of the headphone driver 100 in FIG. 5, and FIG. 7 is a timing diagram for this headphone driver. Referring to FIGS. 6A and 7, before time t1, the digital sequencer 130 activates only the fourth on signal S4 and an inverted signal $\overline{S3}$ of the third on signal S3, and deactivates the first to third and fifth on signals S1 to S3 and S5.

From time t1 to time t5, the power-up operation is performed. The headphone driver 100 attenuates any pop noise that may occur as a result of the power-up operation. At time t1, the digital sequencer 130 activates the first on signal S1. Each of the first and second pre-main amplifiers 110a and 110b is activated in response to the first on signal S1. The headphone driver 100 does not require an auxiliary amplifier. Accordingly, the headphone driver 100 may have a relatively small layout size.

Referring to FIGS. 6A and 7, at time t2, the digital sequencer 130 activates the second on signal S2. The main amplifier 110c is activated in response to the second on signal S2. Accordingly, a feedback path of the auxiliary stage 120 is formed.

Figure 6C:
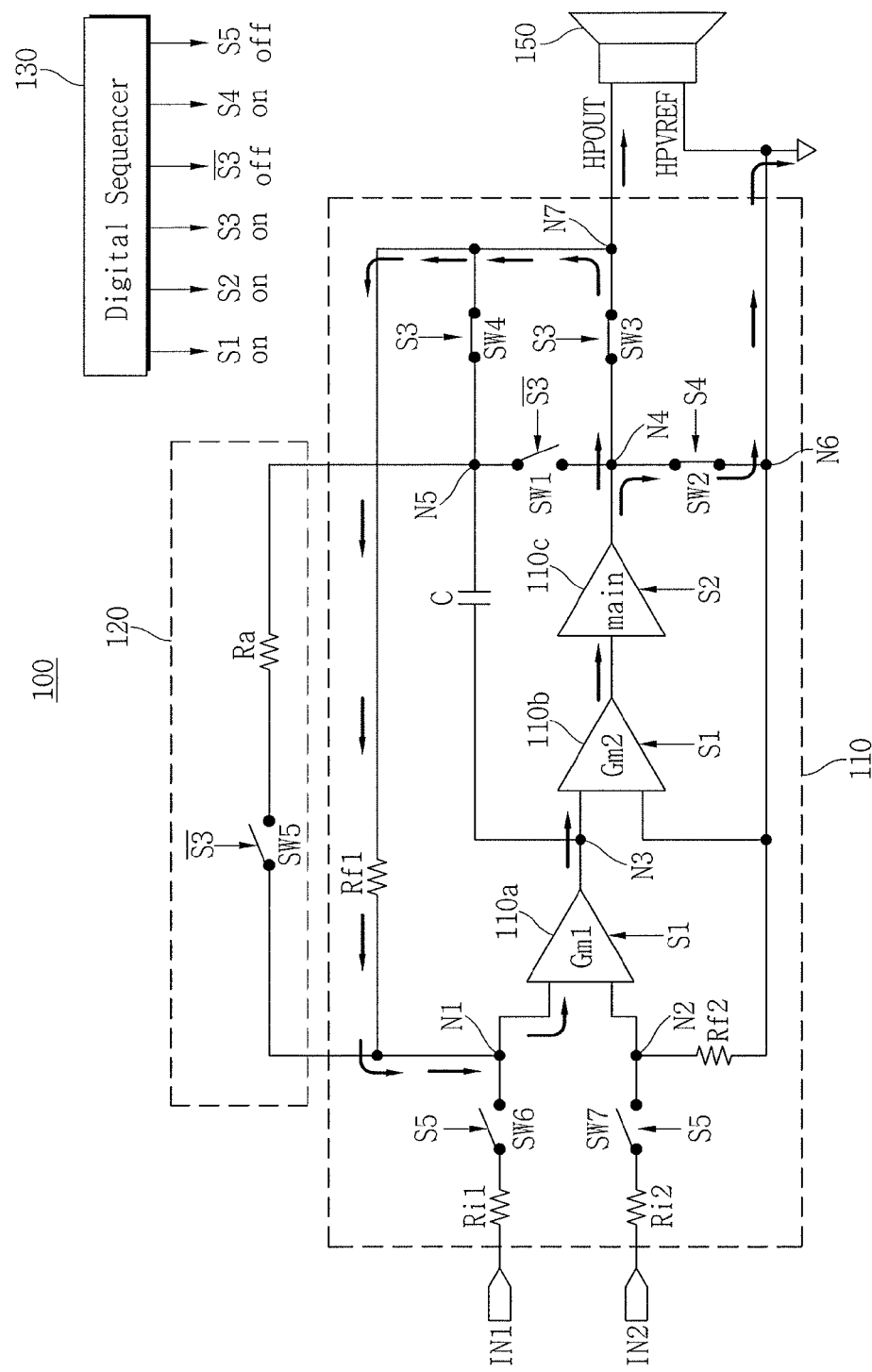

Referring to FIGS. 6C and 7, at time t3, the digital sequencer 130 activates the third on signal S3. The sixth and seventh nodes N6 and N7 are set as a ground voltage. The output node HPOUT is set as the same voltage as the seventh node N7. Further, the the output node HPOUT of the main amplifier 110c is coupled to the ground voltage. Accordingly, peak noise at the output node HPOUT is not generated.

Further, because the third and fourth switches SW3 and SW4 are included in the feedback loop, resistance of the third and fourth switches SW3 and SW4 is divided by a loop gain of the headphone driver 100. Accordingly, the third and fourth switches SW3 and SW4 may be implemented to have a small layout size.

Figure 6D:
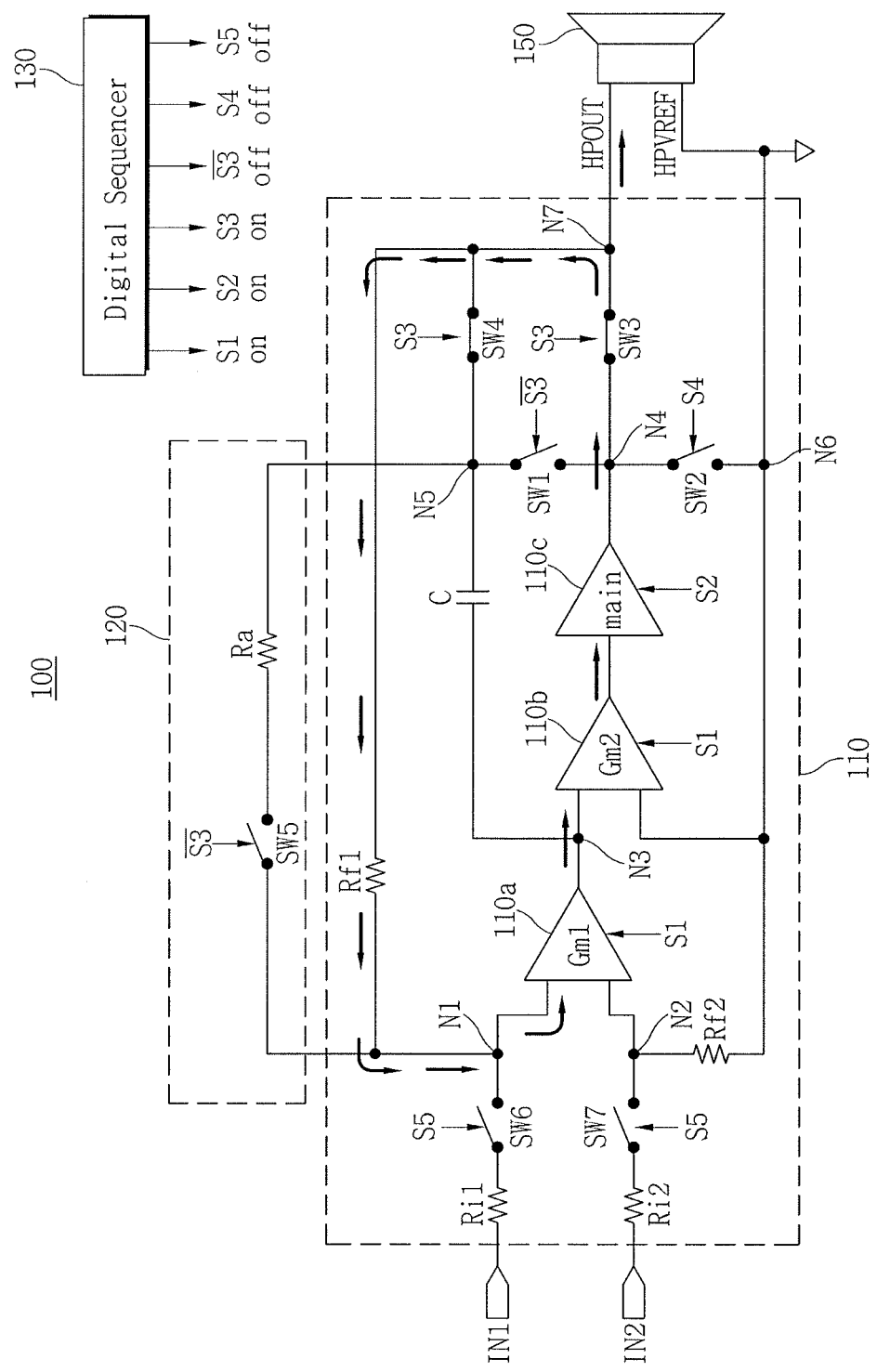

Referring to FIGS. 6D and 7, at time t4, the digital sequencer 130 deactivates the fourth on signal S4. The main amplifier 110c drives the output node HPOUT to a ground voltage through the seventh node N7. For example, because the output node HPOUT is set as the ground voltage, the output node HPOUT does not fluctuate significantly, if at all, when the power is switched on. Accordingly, the headphone driver 100 may attenuate pop noise.

Figure 6E:
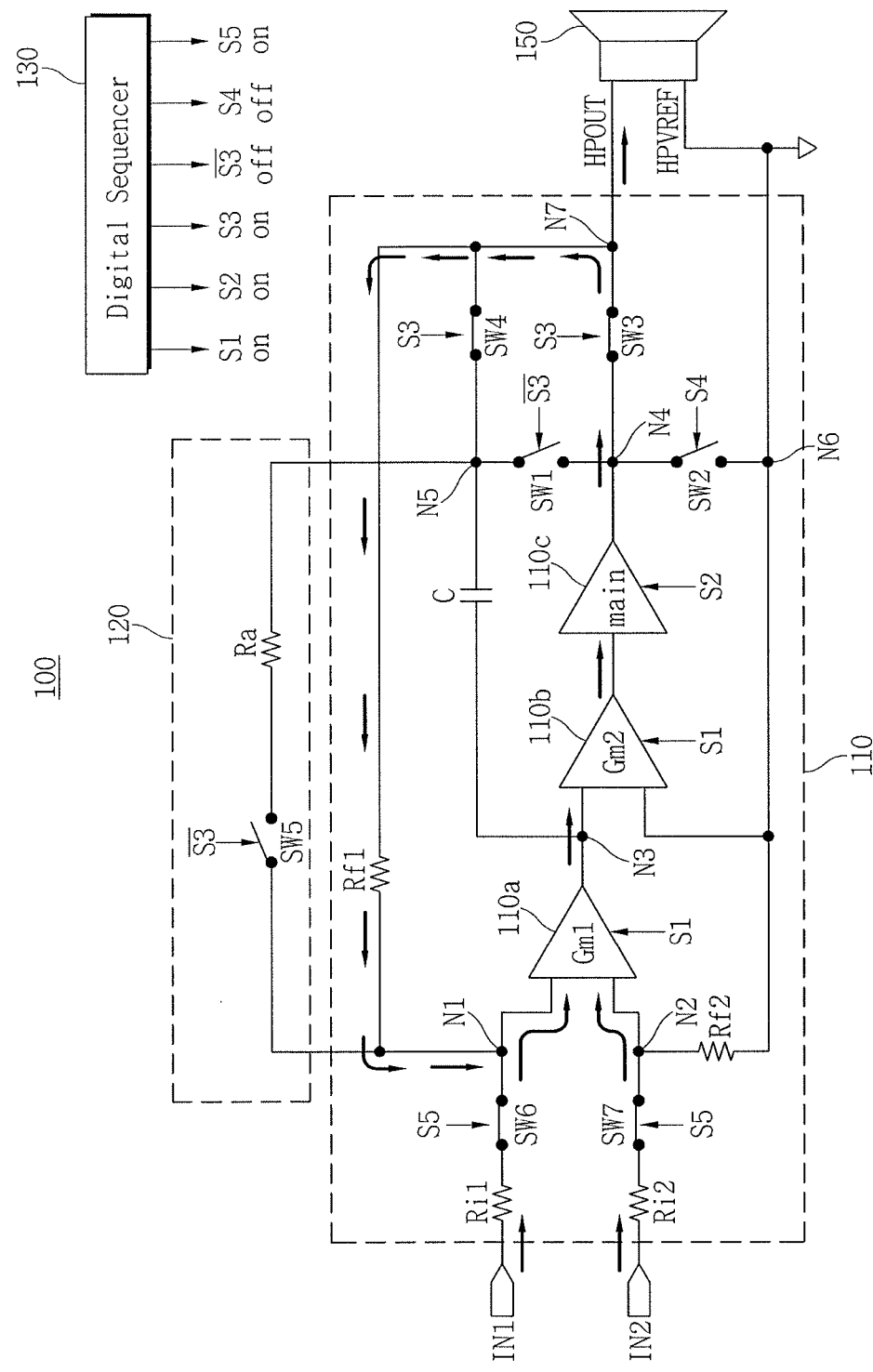

Referring to FIGS. 6E and 7, from time t5 to time t6, the headphone driver 100 performs normal operation. At time t5, the digital sequencer 130 activates the fifth on signal S5. Accordingly, the sixth and seventh switches SW6 and SW7 are activated. An audio signal transmitted from the first and second input terminals IN1 and IN2 is output to the speaker 150 through the first and second pre-main amplifiers 110a and 110b and the main amplifier 110c.

Figure 6F:
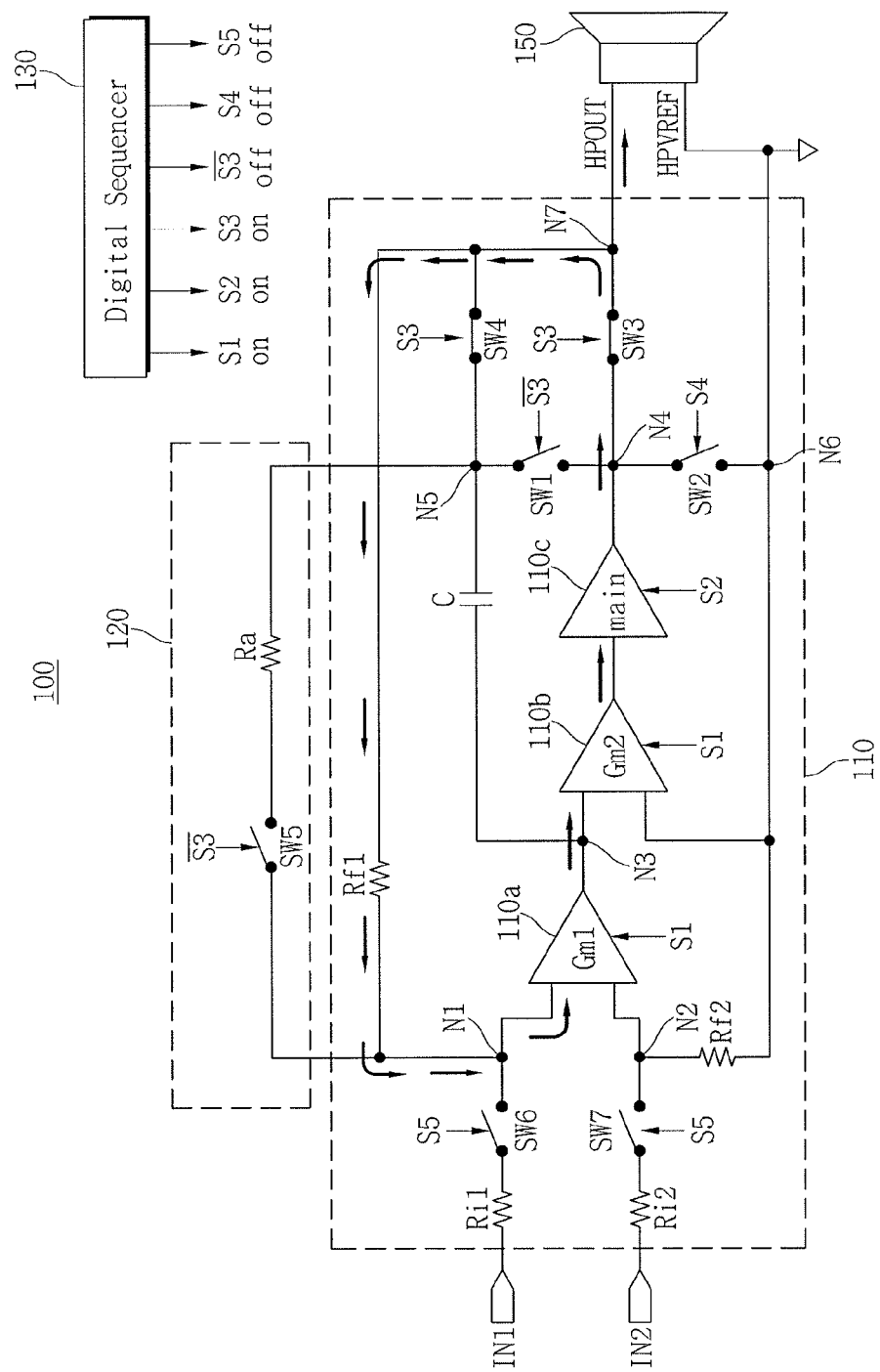

Referring to FIGS. 6F and 7, from time t6 to time t10, the power-down operation is performed. The headphone driver 100 may attenuate any pop noise that may be caused by the power-down operation. At time t6, the digital sequencer 130 deactivates the fifth on signal S5.

The audio signal transmitted from the first and second input terminals IN1 and IN2 is interrupted by the sixth and seventh switches SW6 and SW7. The main amplifier 110c drives the output node HPOUT to ground voltage through the seventh node N7. For example, because the output node HPOUT is set as the ground voltage, the output node HPOUT may not fluctuate significantly, if at all, when the power is switched off. Accordingly, the headphone driver 100 may attenuate pop noise.

Figure 6G:
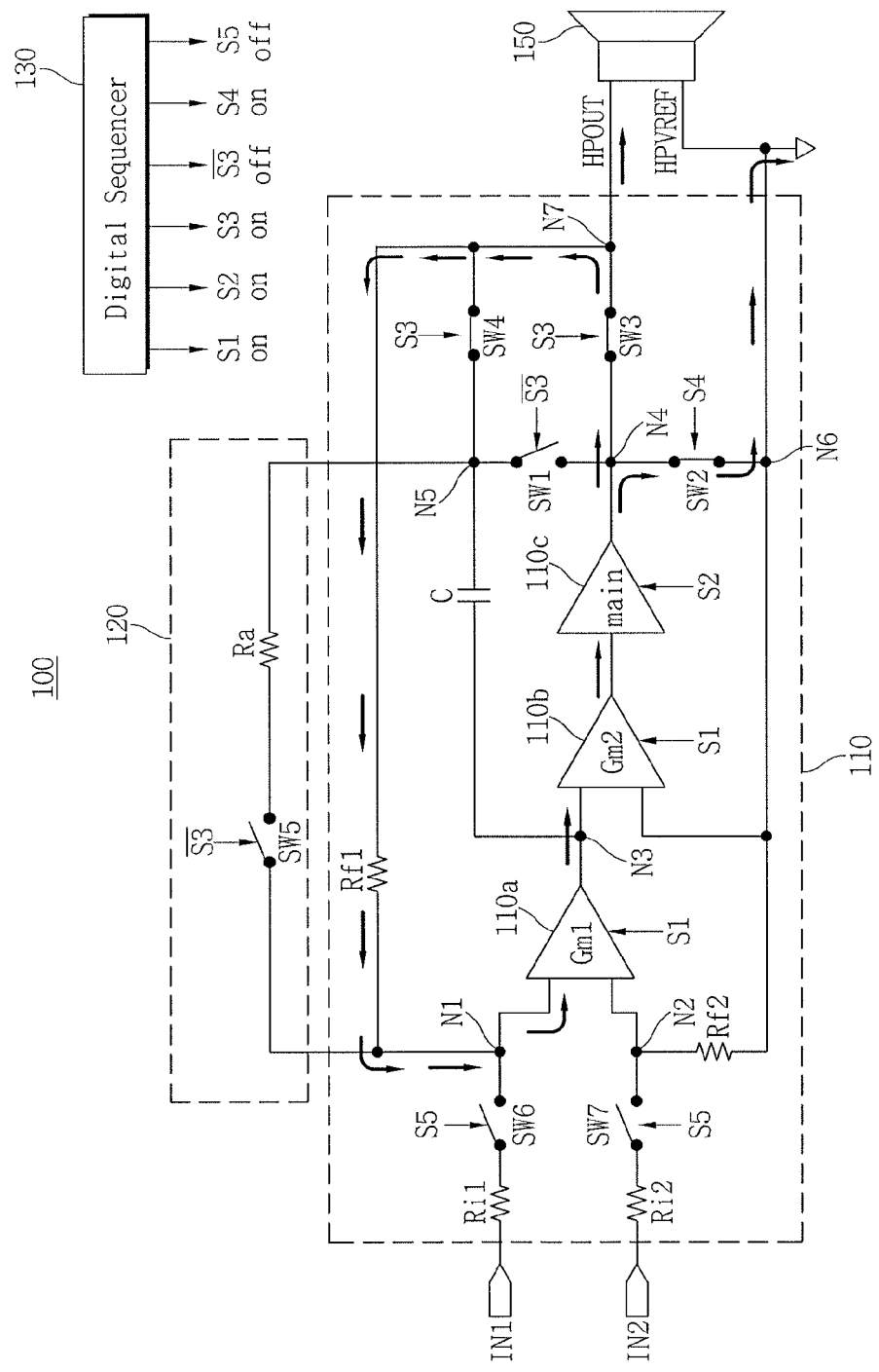

Referring to FIGS. 6G and 7, at time t7, the digital sequencer 130 activates the fourth on signal S4. Before deactivating the main amplifier 110c, the digital sequencer 130 sets an output of the main amplifier 110c as the ground voltage.

Figure 6H:
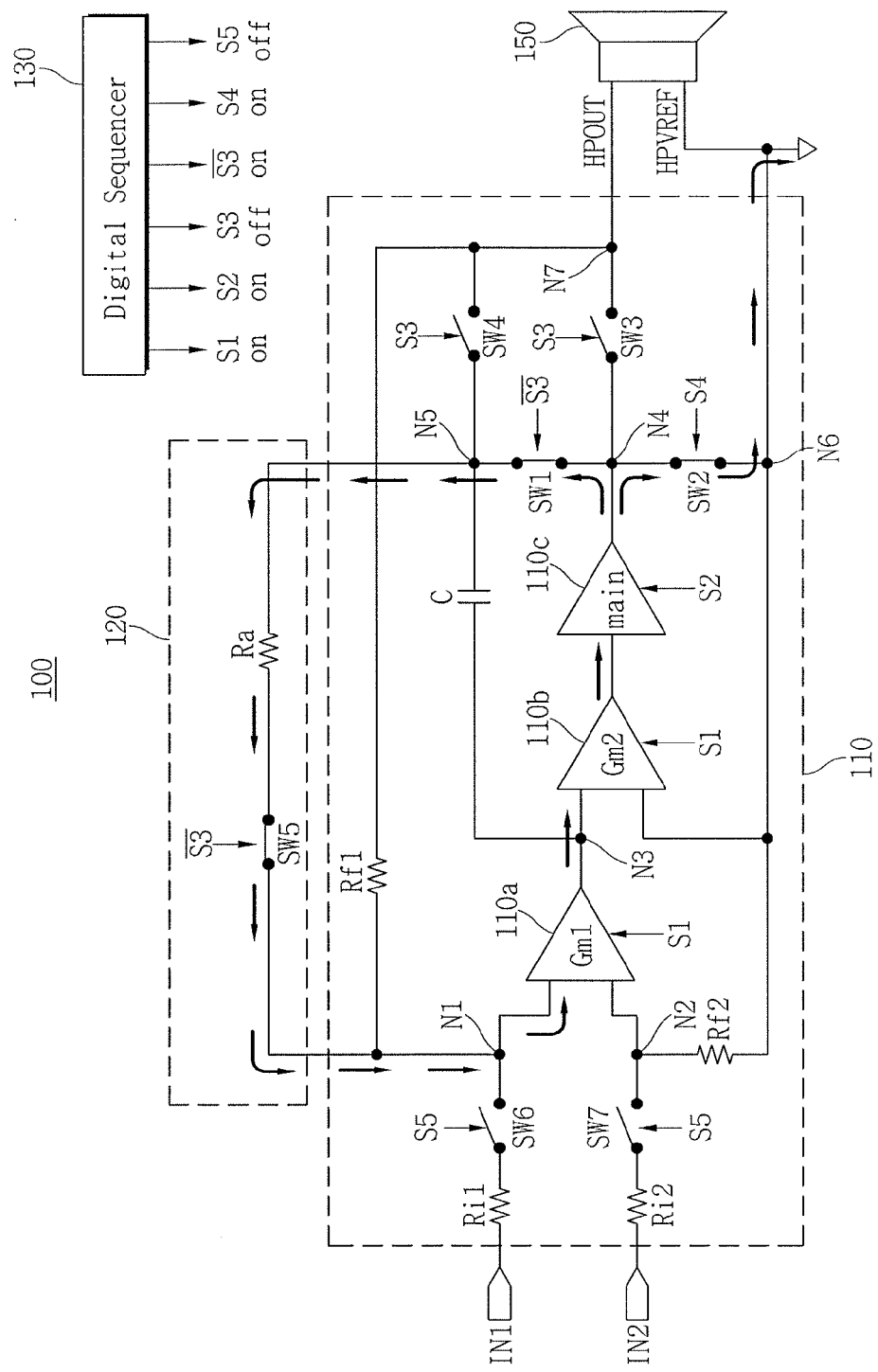

Referring to FIGS. 6H and 7, at time t8, the digital sequencer 130 deactivates the third on signal S3. A path of a feedback loop by the auxiliary stage 120 is formed.

Figure 6I:
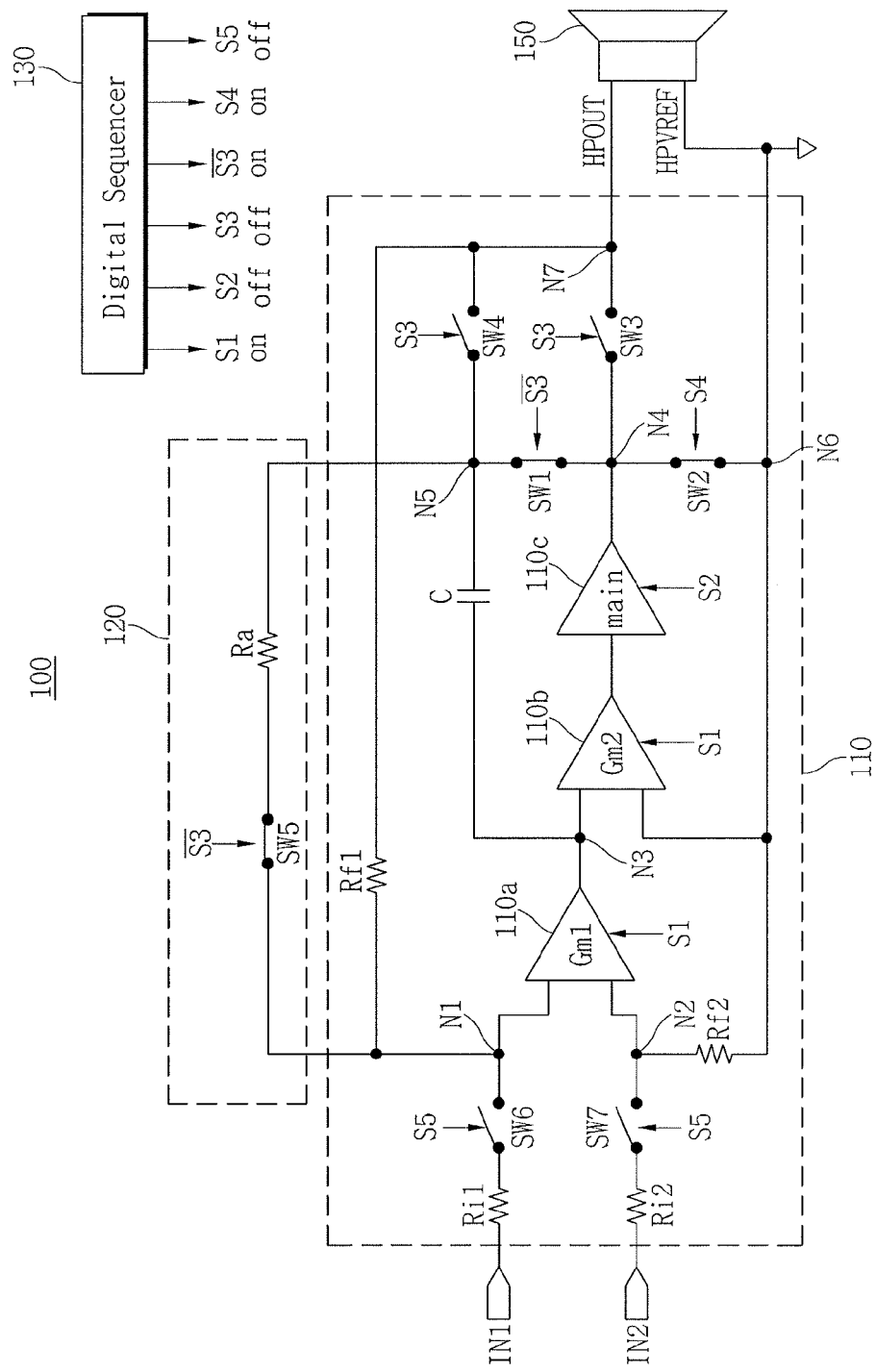

Referring to FIGS. 6I and 7, at time t9, the digital sequencer 130 deactivates the second on signal S2. Accordingly, the main amplifier 110c is deactivated.

At time t10, the digital sequencer 130 deactivates the first on signal S1. Accordingly, the first and second pre-main amplifiers 110a and 110b are deactivated.

After time t10, the digital sequencer 130 activates only the fourth on signal S4 and an inverted signal $\overline{S3}$ of the third on signal S3, and deactivates the first to third and fifth on signals S1 to S3 and S5. The node N7, which is the output node HPOUT, maintains a floating state.

Figure 8A:
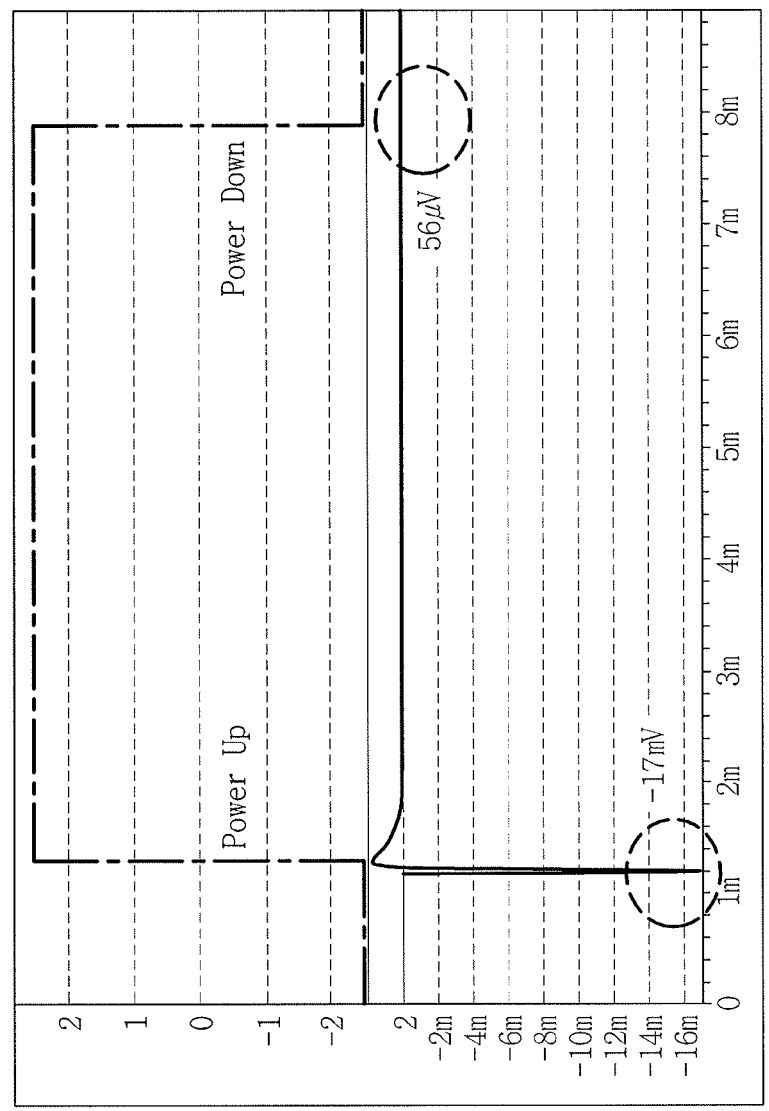
FIGS. 8A and 8B illustrate examples of driving results of the headphone driver in FIG. 5.
Figure 8B:
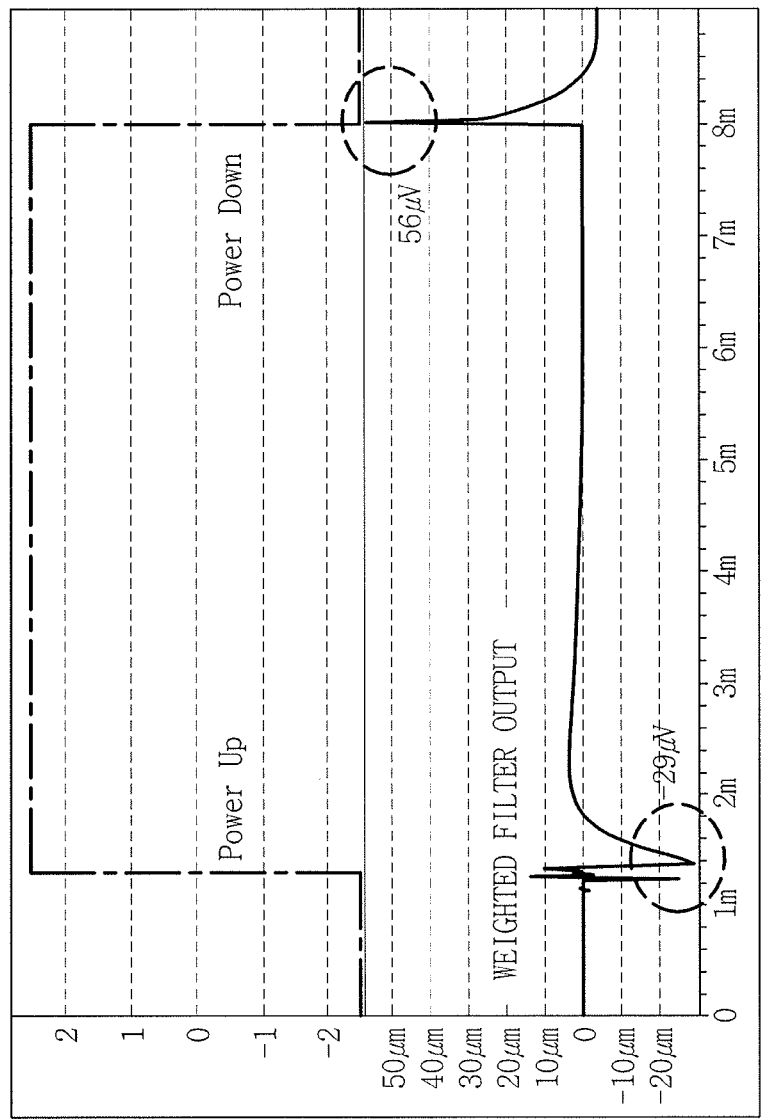

FIGS. 8A and 8B illustrate examples of driving results of the headphone driver 100 in FIG. 5. FIG. 8A is a graph illustrating an output of the headphone driver 100 when pop and click noise is not attenuated. FIG. 8B is a graph showing an example of the output of the headphone driver 100 when pop and click noise is attenuated.

Referring to FIG. 8A, in a power-up operation, a voltage drop of about −17 mV may be generated. Accordingly, pop noise may be generated in the power-up operation. In a power-down operation, a voltage rise of about 56 uV may be generated. Due to output fluctuation, the headphone driver 100 may not generate pop noise.

Referring to FIG. 8B, in the power-up operation, a voltage drop of about −29 uV may be generated by limiting pop noise to a frequency (about 20 to 20000 Hz) which is audible by the human ear (e.g., a weighted filter output). The voltage drop due to the power-up operation may be attenuated about one thousand times compared to the voltage drop shown in FIG. 8A.

Because of output fluctuation, the headphone driver 100 does not generate pop noise in the power-up operation. In the power-down operation of the headphone driver 100, a voltage rise of about 56 uV may be generated.

Figure 9:
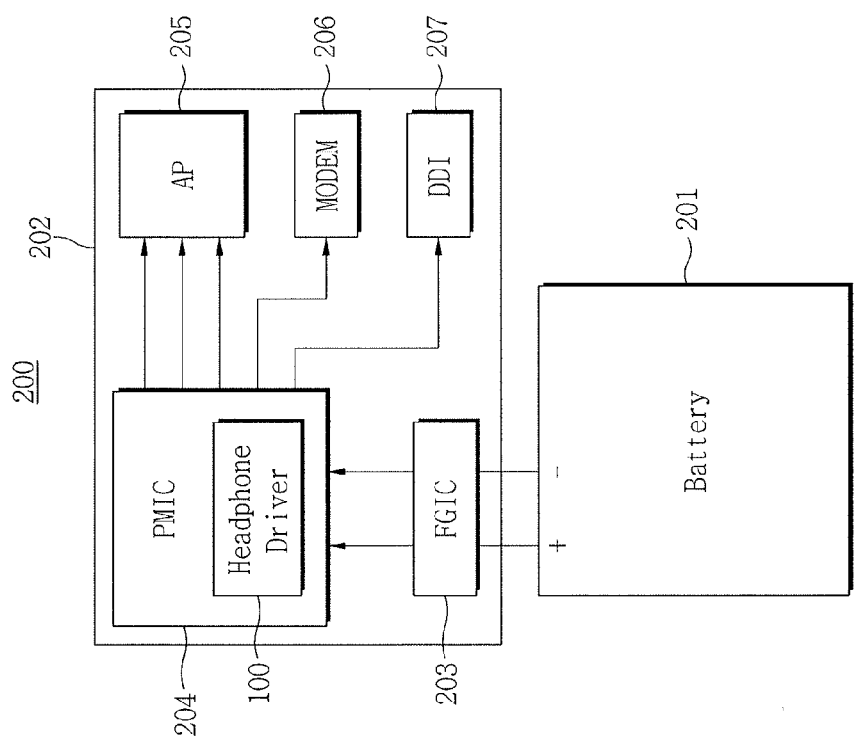
FIG. 9 illustrates an embodiment of a power management integrated circuit having the headphone driver in FIG. 5.

FIG. 9 illustrates an embodiment of a mobile terminal 200 which includes a power management integrated circuit (PMIC) 204 having the headphone driver in FIG. 5. Referring to FIG. 9, the mobile terminal 200 includes a battery 201 and a printed circuit board 202. The battery 201 provides power for the mobile terminal 200, and is connected to a fuel gauge integrated circuit (FGIC) 203. The FGIC 203 measures a charge state of the battery 201. For example, the FGIC 203 may exactly measure current, voltage, and/or temperature of the battery 201 in order to determine the charge state of the battery 201. The battery 201 provides power for the PMIC 204 through the FGIC 203.

The PMIC 204 transfers a state of the battery 201 to a low power state or reduces energy consumption, when the mobile terminal 200 is not in use. Further, the PMIC 204 provides power for various electronic devices installed on or coupled to the PCB 202. For example, the PMIC 204 provides power at a plurality of voltage levels for an application processor (AP) 205. The PMIC 204 may also provide power for a modulator-demodulator (MODEM) 206 and a display driver integrated circuit (DD1) 207. In one embodiment, the PMIC 204 may include the headphone driver 100 as in FIG. 5.

The headphone driver 100 may be provided as a single component in an independent chip. In one embodiment, the headphone driver 100 may be implemented as an audio chip. Examples of the headphone driver 100 implemented as an audio chip will be described with reference to FIGS. 10 to 12.

Figure 10:
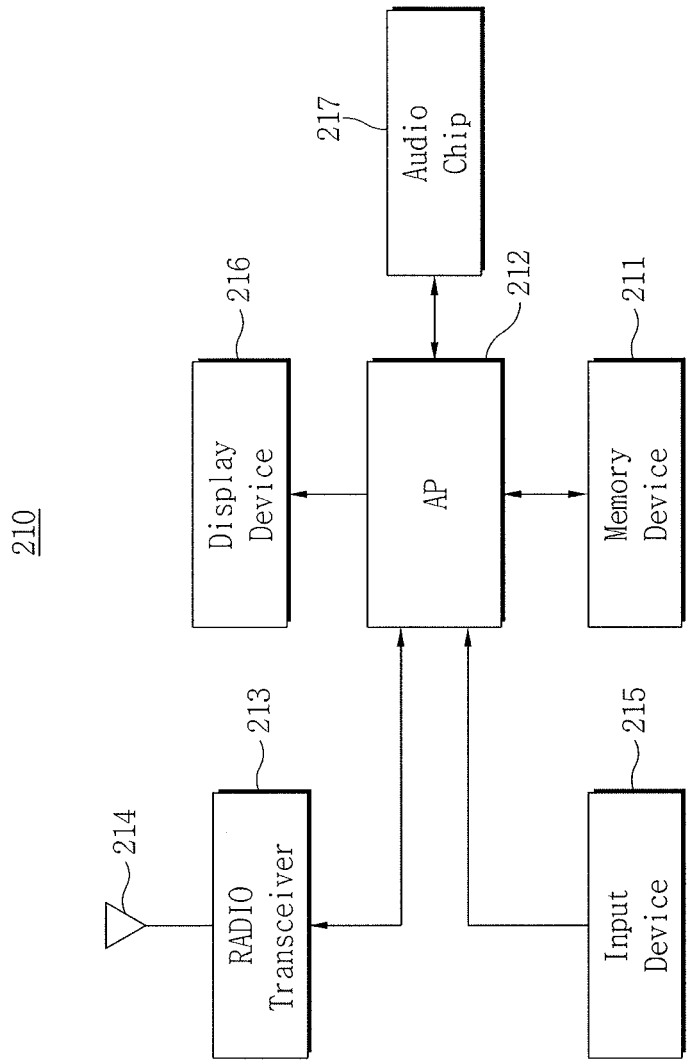
FIG. 10 illustrates an embodiment of a computer system.

FIG. 10 illustrates an embodiment of a computer system having 210 which includes the headphone driver in FIG. 5. Referring to FIG. 10, the computer system 210 includes a memory device 211, an application processor (AP) 212 including a memory controller for controlling the memory device 211, a radio transceiver 213, an antenna 214, an input device 215, a display device 216, and an audio chip 217.

The radio transceiver 213 transmits and receives radio signals through the antenna 214. For example, the radio transceiver 213 converts a radio signal received through the antenna 214 into a signal for processing in the AP 212. Accordingly, the AP 212 may process a signal output from the radio transceiver 213, and transmit the processed signal to the display device 216. Further, the radio transceiver 213 may convert the signal output from the AP 212 to a radio signal, and output the converted radio signal to an external device through the antenna 214.

The input device 215 inputs a control signal for controlling operation of the AP 212 or data processed by the AP 212. The input device 215 may be or include, for example, a pointing device such as a touch pad and a computer mouse, a keypad, or a keyboard.

The audio chip 217 may output sound through an internal speaker of the computer system 210, or an external speaker outside the computer system 210. In one embodiment, the audio chip 217 may be implemented to have the headphone driver 100 in FIG. 5.

Figure 11:
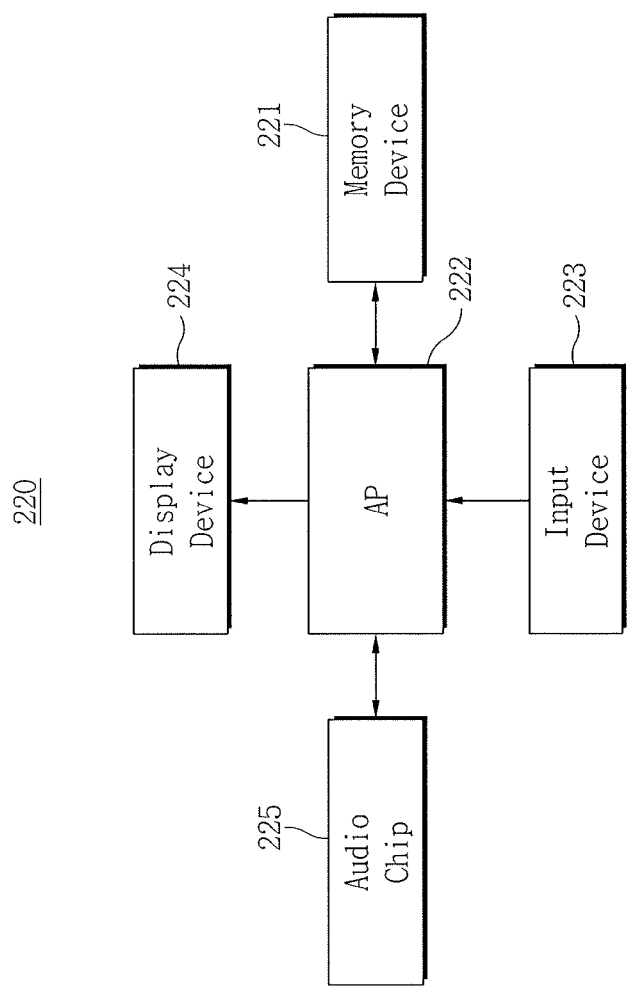
FIG. 11 illustrates another embodiment of a computer system.

FIG. 11 illustrates another embodiment of a computer system 220 having the headphone driver in FIG. 5. Referring to FIG. 11, the computer system 220 may be or include, for example, a personal computer (PC), a network server, a tablet PC, a netbook, an e-reader, a personal digital assistant (PDA), a portable multimedia player (PMP), an MP3 player, or an MP4 player.

The computer system 220 includes a memory device 221, an application processor (AP) 222 including a memory controller for controlling data processing operations of the memory device 221, an input device 223, a display device 224, and an audio chip 225.

The AP 222 may display data stored in the memory device 221 on the display device 224 based on data input through the input device 223. For example, the input device 223 may be, for example, a pointing device such as a touch pad or a computer mouse, a keypad, or a keyboard.

The audio chip 225 may output sound through an internal speaker of the computer system 220, or an external speaker outside the computer system 210. In one embodiment, the audio chip 225 may be implemented to have the headphone driver 100 in FIG. 5.

Figure 12:
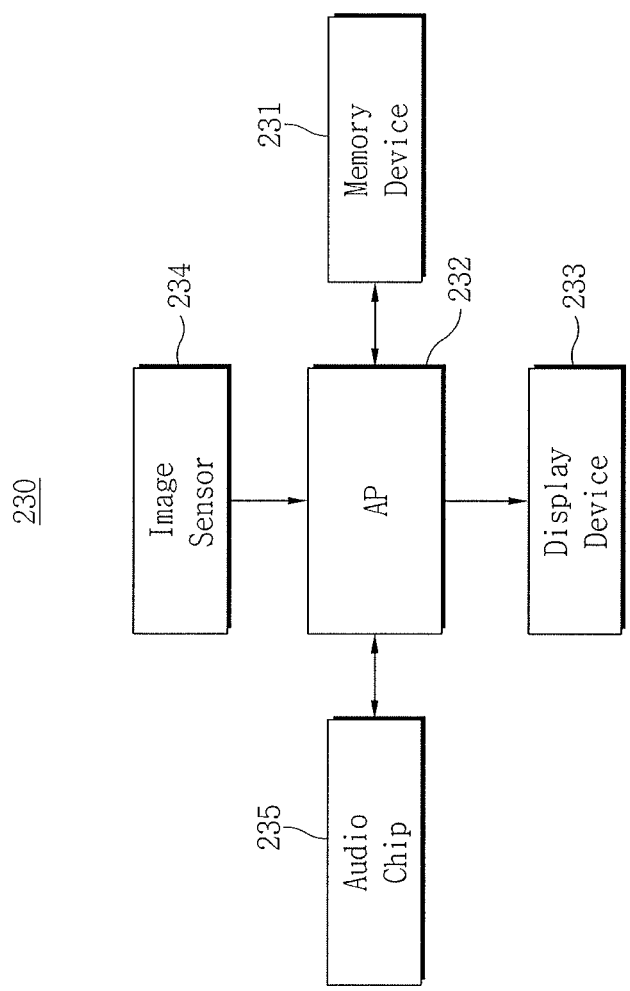
FIG. 12 illustrates another embodiment of a computer system.

FIG. 12 illustrates another embodiment of a computer system 230 having the headphone driver in FIG. 5. Referring to FIG. 12, the computer system 230 may be an image processing device such as, for example, a digital camera, or a mobile phone, a smart phone or a tablet PC on which the digital camera is installed.

The computer system 230 includes a memory device 231, an application processor (AP) 232 including a memory controller for controlling a data processing operation such as, for example, a write operation or a read operation, of the memory device 231, an input device 233, a display device 234, and an audio chip 235.

The image sensor 233 of the computer system 230 converts an optical image into digital signals, and the converted digital signals are transmitted to the AP 232. According to the control of the AP 232, the converted digital signals may be displayed on the display device 234, or stored in the memory device 231. Further, the data stored in the memory device 231 is displayed on the display device 234 according to the control of the AP 232.

The audio chip 235 outputs a sound through an internal speaker of the computer system 230, or an external speaker outside the computer system 230. In one embodiment, the audio chip 235 may be implemented to have the headphone driver 100 in FIG. 5.

By way of summation and review, when turning an audio amplifier on or off, noise may be generated in a headphone speaker. This noise may be referred to as pop and/or click noise.

In accordance with one or more of the aforementioned embodiments, a headphone driver is provided which attenuates pop and click noise generated, for example, during power-up or power-down operations.

For example, a headphone driver and a system on chip (SOC) controls a voltage level of an output node to attenuate any pop and/or click noise that may be generated in a power-up or power-down operation. For example, the headphone driver may attenuate the pop and click noise by maintaining the voltage level of the output node at a reference (e.g., ground voltage) before the power-up or power-down operation.

The methods, processes, and operations described herein may be performed by code or instructions to be executed by the digital sequencer and/or a computer, processor, manager, or controller. Because the algorithms that form the basis of the methods (or operations of the computer, processor, or controller) are described in detail, the code or instructions for implementing the operations of the method embodiments may transform the computer, processor, or controller into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the digital sequencer, computer, processor, manager or controller which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A headphone driver, comprising:
   at least one pre-main amplifier to receive an input signal from a first node and a second node, and to output the input signal to a third node;
   a main amplifier connected between the third node and a fourth node;
   a first switch connected between the fourth node and a fifth node;
   a second switch connected between the fourth node and a sixth node;
   a third switch connected between the fourth node and a seventh node;
   a fourth switch connected between the fifth node and the seventh node;
   a fifth switch connected between the first node and the fifth node;
   a capacitor connected between the third node and the fifth node;
   a first feedback resistor connected between the first node and the seventh node; and
   a second feedback resistor connected between the second node and the sixth node, wherein the sixth node and the seventh node are connected to a speaker.

2. The headphone driver as claimed in claim 1, further comprising:
   a sixth switch connected between the first node and a first input port; and
   a seventh switch connected between the second node and a second input port.

3. The headphone driver as claimed in claim 2, further comprising: a digital sequencer to generate first to fifth on signals for controlling the first to seventh switches.

4. The headphone driver as claimed in claim 3, wherein:
   the at least one pre-main amplifier is activated in response to the first on signal, and
   the main amplifier is activated in response to the second on signal.

5. The headphone driver as claimed in claim 3, wherein:
   the third and fourth switches are activated in response to the third on signal,
   the first and fifth switches are activated in response to an inverted signal of the third on signal,
   the second switch is activated in response to the fourth on signal, and
   the sixth and seventh switches are activated in response to the fifth on signal.

6. The headphone driver as claimed in claim 3, wherein, in a power-up operation, the digital sequencer sequentially performs operations which include activating the first and fourth on signals, activating the second on signal, activating the third on signal, deactivating the fourth on signal, and activating the fifth on signal.

7. The headphone driver as claimed in claim 3, wherein, in a normal operation, the digital sequencer activates the first to third and fifth on signals and deactivates the fourth on signal.

8. The headphone driver as claimed in claim 3, wherein, in a power-down operation, the digital sequencer sequentially performs operations which include deactivating the fifth on signal, activating the fourth on signal, deactivating the third on signal, deactivating the second on signal, and deactivating the first on signal.

9. The headphone driver as claimed in claim 1, wherein:
   the sixth node is connected to a ground voltage, and
   the seventh node has a ground voltage in power-up and power-down operations.

10. A system-on-chip (SOC), comprising:
    a headphone driver; and
    a power supply unit to provide power for the headphone driver, wherein the headphone driver comprises:
    at least one pre-main amplifier to receive an input signal from a first node and a second node, and to output the input signal to a third node;
    a main amplifier connected between the third node and a fourth node;
    a first switch connected between the fourth node and a fifth node;
    a second switch connected between the fourth node and a sixth node;
    a third switch connected between the fourth node and a seventh node;
    a fourth switch connected between the fifth node and the seventh node;
    a fifth switch connected between the first node and the fifth node;
    a capacitor connected between the third node and the fifth node;
    a first feedback resistor connected between the first node and the seventh node;
    a second feedback resistor connected between the second node and the sixth node;
    a sixth switch connected between the first node and a first input port; and
    a seventh switch connected between the second node and a second input port, wherein the sixth node and the seventh node are connected to a speaker.

11. The SOC as claimed in claim 10, further comprising:
    a digital sequencer to generate first to fifth on signals for controlling the first to seventh switches.

12. The SOC as claimed in claim 11, wherein:
    the at least one pre-main amplifier is activated in response to the first on signal,
    the main amplifier is activated in response to the second on signal,
    the third and fourth switches are activated in response to the third on signal,
    the first and fifth switches are activated in response to an inverted signal of the third on signal,
    the second switch is activated in response to the fourth on signal, and
    the sixth and seventh switches are activated in response to the fifth signal.

13. The SOC as claimed in claim 12, wherein
    in a power-up operation, the digital sequencer sequentially performs operations which include activating the first and fourth on signals, activating the second on signal, activating the third on signal, deactivating the fourth on signal, and activating the fifth on signal,
    in a normal operation, the digital sequencer activates the first to third and fifth on signals and deactivates the fourth on signal, and
    in a power-down operation, the digital sequencer sequentially performs operations which include deactivating the fifth on signal, activating the fourth on signal, deactivating the third on signal, deactivating the second on signal, and deactivating the first on signal.

14. The SOC as claimed in claim 10, further comprising a power management integrated circuit.

15. The SOC as claimed in claim 10, further comprising an audio chip.

16. A circuit, comprising:
- a first amplifier to receive input signals;
- a second amplifier coupled between an output of the first amplifier and a first node coupled to a speaker; and
- a first switch coupled between the first node and a reference potential; and
- a second switch coupled between the first node and an input of the first amplifier, wherein the first switch is to couple the first node to the reference potential and the second switch is to couple the first node to the input of the first amplifier during a power-up operation and during a power-down operation, and wherein the first switch and the second switch are to be open during a period between the power-up and power-down operation.

17. The circuit as claimed in claim 16, wherein the input signals have different phases.

18. The circuit as claimed in claim 16, wherein:
- a second node is coupled to a first input of the first amplifier and the reference potential; and
- a third node is coupled to a second input of the first amplifier and the first node.

19. The circuit as claimed in claim 16, wherein:
the first node is coupled to a first input of the speaker, and the reference potential is coupled to a second input of the speaker and the first node through the first switch.

20. The circuit as claimed in claim 16, further comprising:
- a third amplifier coupled between the first and second amplifier; and
- a third switch coupled between the first node and a first input of the third amplifier, wherein the first input of the third amplifier is coupled to an output of the first amplifier and wherein a second input of the third amplifier is coupled to the reference potential.

\* \* \* \* \*